(12) United States Patent
Takasu et al.

(10) Patent No.: US 7,714,624 B2
(45) Date of Patent: May 11, 2010

(54) METHOD FOR CONTROLLING VERTICAL TYPE MOSFET IN BRIDGE CIRCUIT

(75) Inventors: Hisashi Takasu, Hazu-gun (JP); Takeshi Inoue, Nagoya (JP); Tomonori Kimura, Obu (JP); Takanari Sasaya, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/081,976

(22) Filed: Apr. 24, 2008

(65) Prior Publication Data
US 2008/0265975 A1 Oct. 30, 2008

(30) Foreign Application Priority Data
Apr. 25, 2007 (JP) ............................. 2007-115584

(51) Int. Cl.
*H03K 3/00* (2006.01)
(52) U.S. Cl. ................. 327/110; 327/423; 327/424; 327/588
(58) Field of Classification Search ................. 327/110, 327/423, 424, 588
See application file for complete search history.

(56) References Cited

U.S. PATENT DOCUMENTS

| | | | | |
|---|---|---|---|---|
| 4,912,622 A | * | 3/1990 | Steigerwald et al. | 363/98 |
| 6,268,758 B1 | * | 7/2001 | Limmer et al. | 327/424 |
| 6,344,768 B1 | * | 2/2002 | Daun-Lindberg et al. | 327/424 |
| 6,636,431 B2 | | 10/2003 | Seki et al. | |
| 7,332,942 B2 | * | 2/2008 | Gotzenberger et al. | 327/109 |

FOREIGN PATENT DOCUMENTS

| JP | A-H07-194105 | 7/1995 |
|---|---|---|
| JP | A-2005-192394 | 7/2005 |

OTHER PUBLICATIONS

Office Action dated Apr. 28, 2009 from Japan Patent Office in corresponding JP application No. 2007-115584 (and English Translation).

* cited by examiner

*Primary Examiner*—Kenneth B. Wells
(74) *Attorney, Agent, or Firm*—Posz Law Group, PLC

(57) ABSTRACT

A method for controlling a vertical type MOSFET in a bridge circuit is provided to reduce diode power loss and improve a reverse recovery characteristic. The method includes controlling a forward voltage of a built-in diode of the vertical type MOSFET to be a first forward voltage by setting a gate voltage of the vertical MOSFET to a first gate voltage, so that the vertical type MOSFET is switched into a first off mode; and controlling the forward voltage of the built-in diode of the vertical type MOSFET to be a second forward voltage by setting the gate voltage of the vertical MOSFET to a second gate voltage, so that the vertical type MOSFET is switched into a second off mode.

15 Claims, 13 Drawing Sheets

| | | MOSFET | DIRECTION OF INDUCTOR CURRENT | |
|---|---|---|---|---|
| | | | ← | → |
| FULL BRIDGE CIR. | HALF BRIDGE CIR. 1 | Hi | REVERSE RECOVERY | ON/OFF |
| | | Lo | ON/OFF | REVERSE RECOVERY |
| | HALF BRIDGE CIR. 11 | Hi | ON/OFF | REVERSE RECOVERY |
| | | Lo | REVERSE RECOVERY | ON/OFF |

METHOD FOR CONTROLLING VERTICAL TYPE MOSFET IN BRIDGE CIRCUIT

CROSS REFERENCE TO RELATED APPLICATION

The present application is based on Japanese Patent Application No. 2007-115584 filed on Apr. 25 2007, the disclosure of which is incorporated herein by reference.

BACKGROUND OF THE INVENTION

1. Field of the Invention

The present invention relates to a method for controlling a vertical type Metal-Oxide-Semiconductor Field-Effect-Transistor (MOSFET) in a bridge circuit.

2. Description of Related Art

A reverse recovery current due to switching of a MOSFET is one factor in power loss and restriction of high speed switching. According to a conventional configuration to reduce the reverse recovery current, a fast recovery diode (FRD) or a Schottky barrier diode (SBD) is connected in parallel with the MOSFET, and a reverse blocking diode for disabling a body diode is connected with the MOSFET. The above configuration may reduce the switching loss and increase a switching speed. The parallel-connected external SBD is used for suppressing voltage drop across a built-in diode of the MOSFET approximately from 2.0V to 0.4 V.

Connection of the reverse blocking diode according to the conventional manner, however, requires an additional reverse blocking diode. An on-state resistance of the MOSFET may increase, and a circuit may be complicated and enlarged.

A technique for suppressing a reverse recovery phenomenon without using a reverse blocking diode has been proposed in Japanese Unexamined Patent Application Publication Number H7-194105. According to the technique, a lateral type MOSFET includes an insulated gate provided separately from a back gate, and the back gate is reverse-biased.

The technique disclosed in Japanese Unexamined Patent Application Publication Number H7-194105 is applicable to a lateral type MOSFET but may be unsuitable for a vertical type MOSFET, which is frequently used for high power application. Moreover, an additional control terminal and an additional reverse bias power supply are required, which may lead to complication and enlargement of a circuit.

Furthermore, a self turn-on phenomenon may occur easier in a case of a MOSFET having a large ratio of feedback capacity to input capacity. In the self turn-on phenomenon, a gate voltage of a MOSFET instantaneously exceeds a threshold voltage in case of switching the MOSFET.

SUMMARY OF THE INVENTION

In view of the above-described problem, it is an object of the present invention to provide a method for controlling a vertical type MOSFET to reduce diode power loss, improve a reverse recovery characteristic, and suppress self turn-on.

According to a first aspect of the present invention, a method for controlling a vertical type MOSFET in a bridge circuit is provided, wherein the bridge circuit includes an external diode connected in inverse-parallel with the vertical type MOSFET, and the bridge circuit is configured so that a gate voltage of the vertical type MOSFET controls a forward voltage of a built-in diode of the vertical type MOSFET. The method includes controlling the forward voltage of the built-in diode to be a first forward voltage by setting the gate voltage of the vertical MOSFET to a first gate voltage, so that the vertical type MOSFET is switched into a first off mode, which is one of modes in an off state of the vertical type MOSFET. In the first off mode, a current flowing through the built-in diode is larger than a current flowing through the external diode. The method further includes controlling the forward voltage of the built-in diode to be a second forward voltage by setting the gate voltage of the vertical MOSFET to a second gate voltage, so that the vertical type MOSFET is switched into a second off mode, which is another one of modes in the off state of the vertical type MOSFET. In the second off mode, the current flowing through the built-in diode is smaller than the current flowing through the external diode. In the controlling the forward voltage of the built-in diode to be the first forward voltage and in the controlling the forward voltage of the built-in diode to be the second forward voltage, a relation Vfd<Vf1<Vf2 or a relation Vf1<Vfd<Vf2 is satisfied. Here Vf1, Vf2, and Vfd are defined as the first forward voltage of the built-in diode, the second forward voltage of the built-in diode, and a forward voltage of the external diode, respectively.

According to the above method, it is possible to switch the vertical type MOSFET into the first off mode, in which the current flowing through the built-in diode is larger than the current flowing through the external diode and it is possible to switch the vertical type MOSFET into the second off mode, in which the current flowing through the built-in diode is smaller than the current flowing through the external diode. It is possible to reduce diode power loss, improve a reverse recovery characteristic, and suppress self turn-on.

According to a second aspect of the present invention, a method for controlling a first vertical type MOSFET and a second vertical type MOSFET is provided, wherein the first and second vertical type MOSFETs are connected in series to provide a half bridge circuit, the half bridge circuit includes a first external diode connected in inverse-parallel with the first vertical type MOSFET and a second external diode connected in inverse-parallel with the second vertical type MOSFET, each vertical type MOSFET includes a built-in diode, and the half bridge circuit are configured so that a gate voltage of each vertical type MOSFET controls a forward voltage of the built-in diode of the vertical type MOSFET. The method includes controlling the forward voltage of the built-in diode of each vertical type MOSFET to be a first forward voltage by setting the gate voltage of the vertical type MOSFET to a first gate voltage, so that the vertical type MOSFET is switched into a first off mode, which is one of modes in an off state of the vertical type MOSFET. In the first off mode, a current flowing through the built-in diode of the vertical type MOSFET is larger than a current flowing through the external diode connected in inverse-parallel with the vertical type MOSFET. The method further includes controlling the forward voltage of the built-in diode of each vertical type MOSFET to be a second forward voltage by setting the gate voltage of the vertical type MOSFET to a second gate voltage, so that the vertical type MOSFET is switched into a second off mode, which is another one of modes in the off state of the vertical type MOSFET, wherein, in the second off mode, the current flowing through the built-in diode of the vertical type MOSFET is smaller than the current flowing through the external diode connected in inverse-parallel with the vertical type MOSFET. The method further includes setting the gate voltage of each vertical type MOSFET to a third gate voltage, so that the vertical type MOSFET is switched into an on state. The method further includes controlling the forward voltage of the built-in diode of one of the first and second vertical type MOSFETs by setting the gate voltage of the one of the first and second vertical type MOSFETs when the other of the first and second vertical type MOSFETs is switched from the off state into the on state, so that the one of the first and second vertical type MOSFETs is controlled to be in the first off mode or the second off mode. In the controlling the forward voltage of the built-in diode of each vertical type MOSFET to be the first forward voltage, in the controlling the forward voltage of the built-in diode of each vertical type MOSFET to be the second forward voltage, in the setting the gate voltage of each vertical type MOSFET to the third gate voltage, and in the controlling the forward voltage of the built-in diode of the one of the first and second vertical type MOSFETs, a relation Vfd<Vf1<Vf2 or a relation Vf1<Vfd<Vf2 is satisfied, where Vf1, Vf2, and Vfd are defined as the first forward voltage of the built-in diode of each vertical type MOSFET, the second forward voltage of the built-in diode of each vertical type MOSFET, and a forward voltage of the external diode connected with each vertical type MOSFET, respectively.

According to the above method, it is possible to switch each vertical type MOSFET into the first off mode, in which the current flowing through the built-in diode of the vertical type MOSFET is larger than the current flowing through the external diode connected in inverse-parallel with the vertical type MOSFET. Also, it is possible to switch each vertical type MOSFET into the second off mode, in which the current flowing through the built-in diode of the vertical type MOSFET is smaller than the current flowing through the external diode connected in inverse-parallel with the vertical type MOSFET. Also, it is possible to switch each vertical type MOSFET into the on state. Therefore, it is possible to reduce diode power loss, improve a reverse recovery characteristic, and suppress self turn-on.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 14:
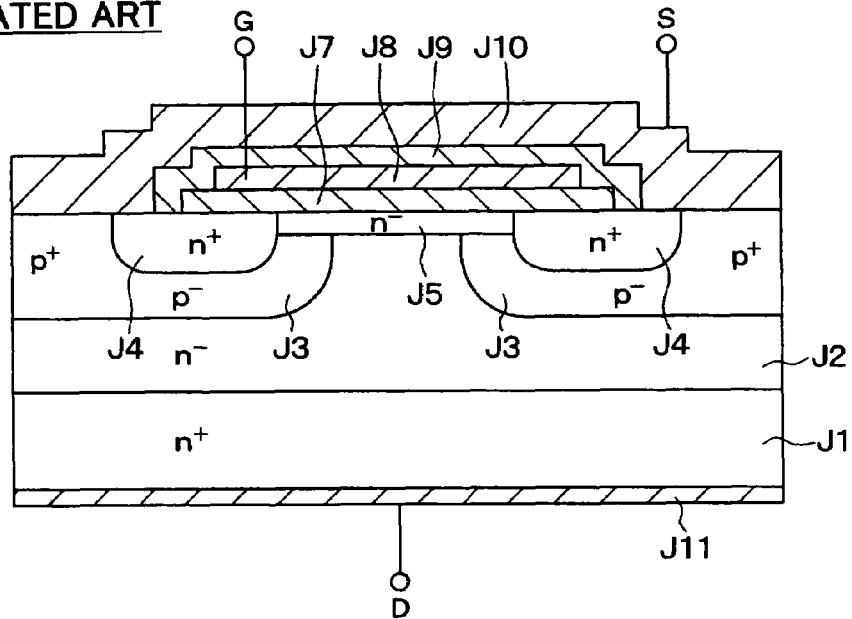
FIG. 14 is a cross sectional view of an N channel accumulation-mode vertical type MOSFET according to the related art.

An N channel accumulation-mode vertical type MOSFET according to a related art is explained below with reference to FIG. 14. FIG. 14 shows a cross sectional view of the N channel accumulation-mode vertical type MOSFET. The MOSFET is provided by the inventors as a comparison example device. In order to reduce a channel resistance, the N channel accumulation-mode vertical type MOSFET includes an N− type channel layer disposed between a P type base layer and a gate oxide layer. An N− type drift layer 32 is laminated on a principal surface of N+ type substrate J1 made of silicon carbide (SiC). A P type base region J3 is disposed in a surface layer of the N− type drift layer J2. An N+ type source region 34 is disposed in a surface layer of the P type base region J3. An N− type SiC layer J5 having a projected shape is disposed in the surface layer of the P type base region J3 so that the N− type SiC layer J5 connects the N+ type source region 34 with the N− type drift layer 32. The N− type SiC layer 35 functions as a channel layer when a device associated with the vertical type MOSFET is in operation. Furthermore, a gate oxidation layer J7 is formed on the N− type SiC layer 35 and the N+ type source region J4 by thermal oxidation. A gate electrode J8 is disposed on the gate oxidation layer J7. The gate electrode J8 is covered by an insulating layer J9. A source electrode J10, which is electrically connected with the N+ type source region J4 and the P type base region J3, is disposed on the insulating layer J9. A drain electrode J11 is disposed on a rear surface of the N+ type substrate.

Figure 15:
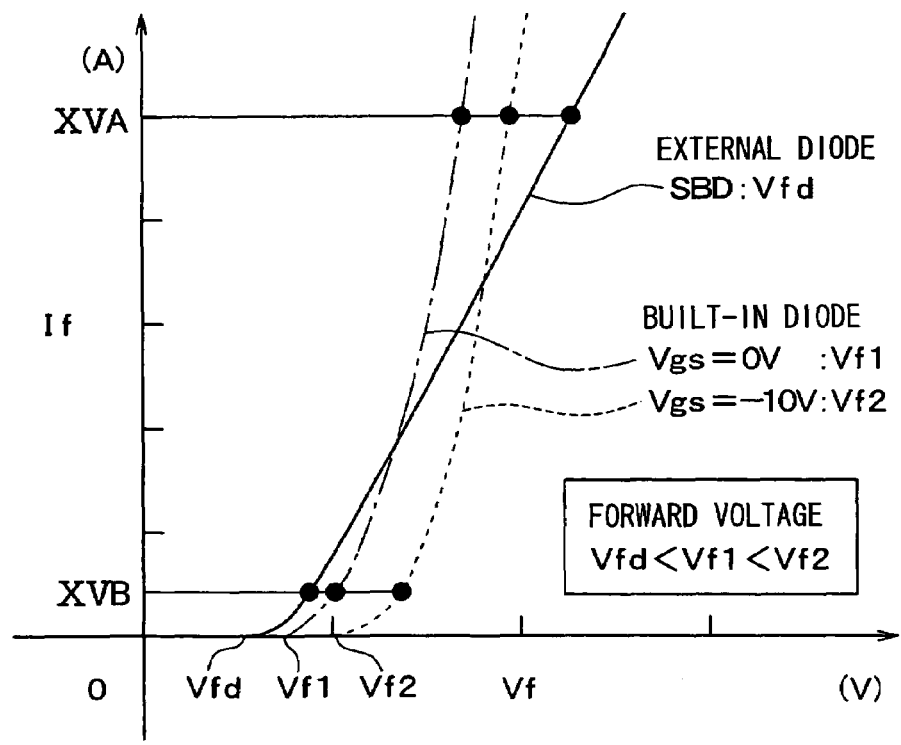
FIG. 15 is a graph showing currents flowing through a built-in diode of and an external diode connected with the N channel accumulation-mode vertical type MOSFET as a function of applied forward voltage.

Vertical type MOSFETs having the above-described structure may reduce a channel resistance but provide the following characteristics originating from its structure. The characteristics are described below with reference to FIG. 15. FIG. 15 is a graph showing forward currents of a built-in diode of the N channel vertical type MOSFET and an external SBD diode with reference to a forward voltage. Here, a symbol XVA represents a large current region and a symbol XVB represents a small current region. The built-in diode may be a parasitic diode.

When a drain-source voltage is smaller than 0 [V] in a case of switching off the MOSFET in a condition of a gate voltage being 0 Volt, an electric field is applied to the N− type SiC layer J5 through the drain electrode J11, the N+ type substrate J1, and the N− drift layer J2. Thereby, a channel of the MOSFET may be partially formed, and a current may leak.

In addition, when the MOSFET is switched off in a condition of the gate voltage being 0 [V], a forward voltage of the built-in diode of the MOSFET reduces to Vf1. In the above case, a voltage difference between the forward voltage Vf1 of the built-in diode and the forward voltage Vfd of the parallel-connected SBD becomes small, and a current is thereby easier to flow through the built-in diode in the small current region XVB shown in FIG. 15. For the above reason, minute reverse recovery characteristics of the SBD may not effectively function. When a reverse blocking diode is additionally connected, an on-state resistance increases.

When the MOSFET is switched off in a condition of a gate voltage being −10 [V], the forward voltage of the built-in diode increases to Vf2. Since the forward voltage of the built-in diode increases to Vf2, a voltage drop across the built-in diode increases by (Vf2−Vf1) in the large current region XVA shown in FIG. 15. In the large current region XVA shown in FIG. 15, a forward current of the built-in diode is larger than that of the parallel-connected SBD. Power loss in the built-in diode thus increases.

In view of the above difficulty, a bridge circuit including a vertical type MOSFET having a built-in diode connected in parallel with an external diode is presented below to reduce power loss in the built-in diode, to improve a reverse recovery characteristic, and to restrict an occurrence of a self turn-on phenomenon.

First Embodiment

A controller of a half bridge circuit 1 and the half bridge circuit 1 including vertical type MOSFETs according to a first embodiment is described below with reference to FIGS. 1 to 6.

Figure 1:
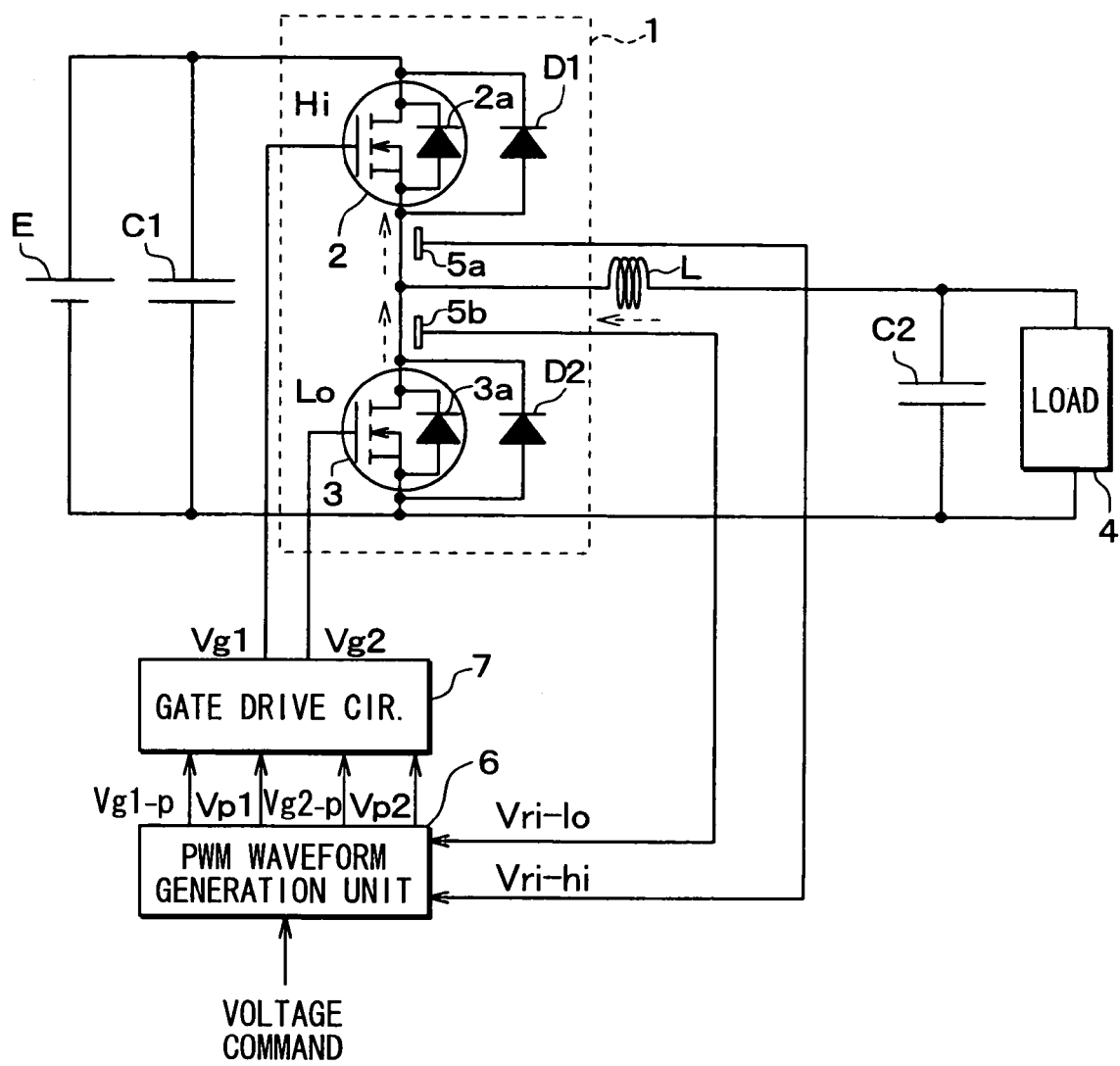
FIG. 1 is a schematic circuit diagram illustrating a half bridge circuit having vertical type MOSFETs and a controller for the half bridge circuit.

As shown in FIG. 1, the half bridge circuit 1 includes two vertical type MOSFETs 2, 3 connected in series and may be used as, for example, a step down inverter. In the present embodiment, an N channel accumulation-mode vertical type MOSFETs, which includes an N-channel layer disposed between a P type base layer and a gate oxidation layer, is used as each MOSFET 2, 3. Alternatively, an inversion-mode vertical type MOSFET may be used as each MOSFETs 2, 3.

An external diode D1 is connected in parallel with a built-in diode 2a of the vertical type MOSFET 2. An external diode D2 is connected in parallel with a built-in diode 3a of the vertical type MOSFET 3. A gate voltage of each MOSFET 2, 3 can control a forward voltage Vf of the built-in diode 2a, 3a of each MOSFET 2, 3. Both ends of the two series-connected vertical type MOSFETs 2, 3 are connected with an input power supply L as well as a power supply stabilization capacitor C1. A load 4 and a capacitor C2 are connected to a line between the two vertical type MOSFETs 2, 3 through an inductor L. The external diode D1 is connected in inverse-parallel with the vertical type MOSFET 2. The external diode D2 is connected in inverse-parallel with the vertical type MOSFET 3. The load 4 is driven by alternately turning on and off the two vertical type MOSFETs 2 and 3. The load 4 to be driven is, for example, an inductive load such as a motor, resistance load, and a combination load including an inductive load and a resistance load. In the present disclosure, one of the two vertical type MOSFETs 2, 3 arranged in a high side (power supply line) is defined as a Hi-MOSFET 2, and the other of the two vertical type MOSFETs 2, 3 arranged in a low side power supply line is defined as a Lo-MOSFET 3.

The controller for the half bridge circuit 1 includes current detection units 5a, 5b, a Pulse Width Modulated (PWM) waveform generation unit 6, and a gate drive circuit unit 7.

The current detection units 5a and 5b detect currents flowing through the Hi-MOSFET 2 and the Lo-MOSFET 3, respectively. Each current detection unit 5a, 5b is arranged in a direction so that a reverse recovery current changes from positive to negative, and then changes from negative to approximately 0. The currents detected by the current detection units 5a, 5b are, respectively, converted into voltages, which are transmitted to the PWM waveform generation unit 6. More specifically, a voltage signal Vri-hi transmitted to the PWM waveform generation unit 6 is associated with the current flowing through the Hi-MOSFET 2. A voltage signal Vri-lo transmitted to the PWM waveform generation unit 6 is associated with the current flowing through the Lo-MOSFET 3. The current detection unit 5a, 5b may be provided by a Hall element, a current-voltage conversion element including a shunt resistor, or the like.

Based on the signals from the current detection units 5a, 5b and a voltage command value, the PWM waveform generation unit 6 determines a time to switch on and off the MOSFETs 2, 3 and corresponding voltages. The PWM waveform generation unit 6 outputs various signals such as a signal Vg1-p, a signal Vg2-p, a signal Vp1, and a signal Vp2.

Based on the signals Vg1-p, Vg2-p, Vp1, Vp2 output from the PWM waveform generation unit 6, the gate drive circuit unit 7 controls a time when a voltage is applied to a gate of each MOSFET 2, 3, and a value of the voltage to be applied. The gate driver circuit 7 applies a predetermined gate voltage to the MOSFET 2, 3 at a predetermined time, and thereby controls an on state and an off state of the MOSFETs 2, 3.

Example circuits of the PWM waveform generation unit 6 and the gate drive circuit unit 7 are described below with reference to FIG. 2 and FIG. 3, respectively.

Figure 2:
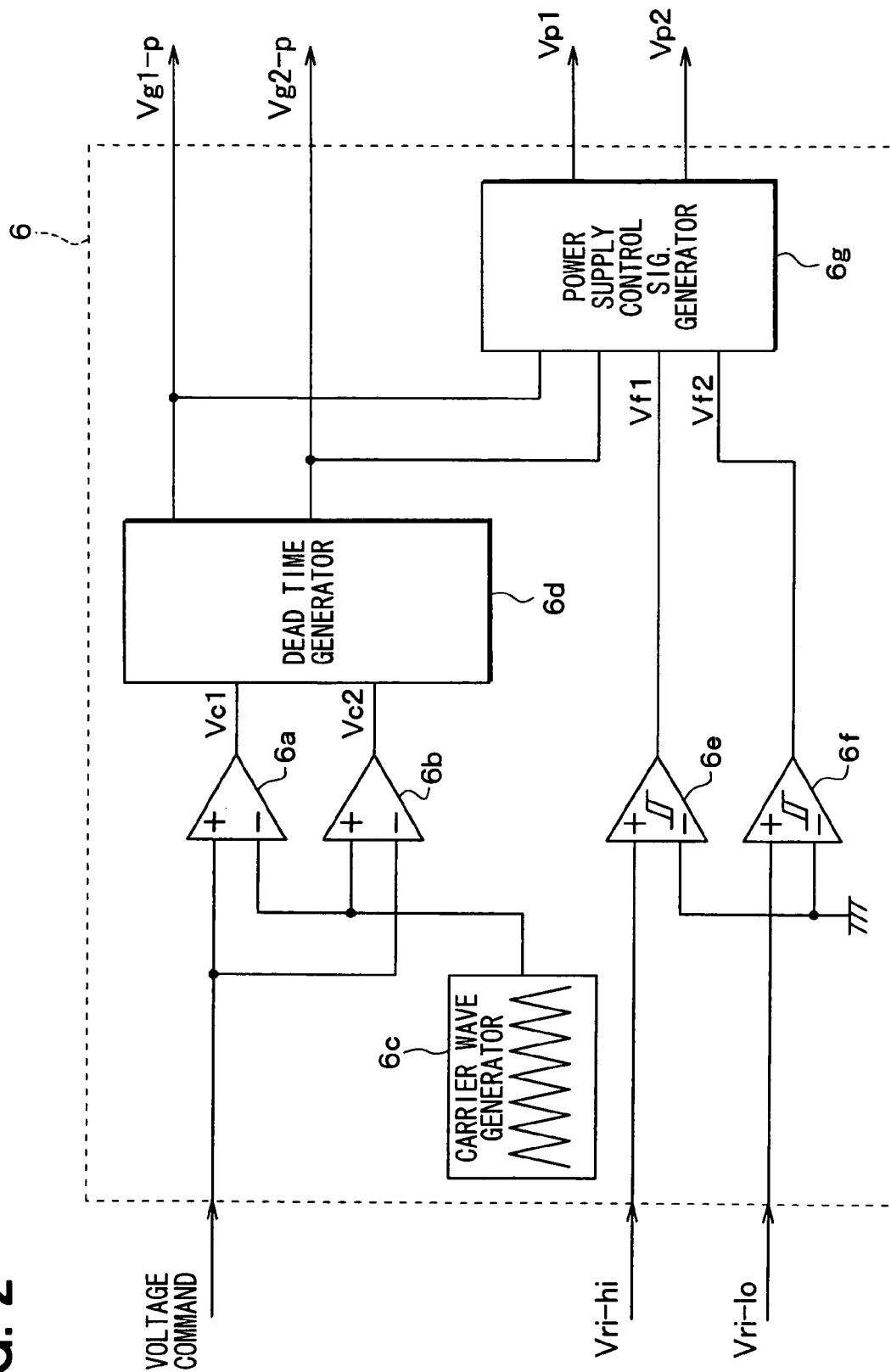
FIG. 2 is a schematic circuit diagram illustrating a PWM waveform generation unit shown in FIG. 1.

As shown in FIG. 2, the PWM waveform generation unit 6 includes two comparators 6a, 6b, a carrier wave generation element 6c, and a dead time generation element 6d. The signals Vg1-p, Vg2-p are provided by the elements 6a, 6b, 6c. The PWM waveform generation unit 6 further includes two hysteresis comparators 6e, 6f and power supply control signal generation element 6g. The elements 6e, 6f, 6g produce the signals Vp1, Vp2.

The voltage command value, which is output from an ECU (Electronic Control Unit) for controlling a load, is input to the PWM waveform generation unit 6. The command voltage value is input to a non-inverting input terminal of the comparator 6a and an inverting input terminal of the comparator 6b. A PWM carrier wave, which may be a triangular wave, is output from the carrier wave generation element 6c to an inverting input terminal of the comparator 6a and a non-inverting input terminal of the comparator 6b. The comparator 6a outputs a signal Vc1, which is in a high level when a level of the voltage command value is larger than that of the carrier wave. The comparator 6b outputs a signal Vc2, which is an inverted signal of the signal Vc1. The signals Vc1, Vc2 are input to the dead time generation element 6d. That is, the comparators 6a, 6b produce the signals Vc1, Vc2, levels of which are inverted to each other. Each comparator 6a, 6b may be provided by a magnitude comparator when each of the voltage command value and the carrier wave is output as a digital data. Alternatively, each comparator 6a, 6b may be provided by an analog comparator when each of the voltage command value and the carrier wave is output as an analog data.

The dead time generation element 6d corrects on-off timings of signals Vc1, Vc2 to provide a dead time. During the dead time, both the Hi-MOSFET 2 and the Lo-MOSFET 3 are in the off state. The dead time is provided in order to prevent, for example, the Hi-MOSFET 2 and the Lo-MOSFET 3 from being in an on state at the same time when the MOSFETs 2, 3 are switched between on and off. The dead time generation element 6d outputs gate signals Vg1-p, Vg2-p to the gate drive circuit unit 7.

The voltage signal Vri-hi, which results from conversion of the current flowing through the Hi-MOSFET 2 into a voltage, is input to a non-inverting input terminal of the comparator 6e. The voltage signal Vri-lo, which results from conversion of the current flowing through the Lo-MOSFET 3 into a voltage, is input to a non-inverting input terminal of the comparator 6f. Inverting input terminals of the comparators 6e, 6f are grounded and accordingly have a zero electric potential. The comparator 6e thus outputs a signal Vf1 with a low level when a level of the voltage signal Vri-hi is lower than a zero level corresponding to a ground level. The comparator 6f outputs a signal Vf1 with a high level when a level of the voltage signal Vri-lo is lower than the zero level corresponding to the ground level. The signals Vf1, Vf2 are input to the power supply control signal generation element 6g. Since the reverse recovery phenomenon causes the currents detected by the current detection units 5a, 5b to change from positive to negative and further change from negative to approximately 0, a reverse recovery phenomenon period is detected based on a period, in which the negative current flow is indicated by the voltage. Thus, it is possible to determines the period of the signals Vf1, Vf2 being in the low level as the reverse recovery phenomenon period.

Each comparator 6e, 6f may be provided by a magnitude comparator when information on the current flowing through the vertical type MOSFET 2, 3 is output as a digital data. Alternatively, each comparator 6e, 6f may be provided by an analog comparator when information on the current flowing through the vertical type MOSFETs 2, 3 is output as an analog data. The analog comparator having a hysteresis characteristic may stably convert and detect the current. In the present embodiment and the following embodiments, the analog comparator having a hysteresis characteristic provides the comparator 6e, 6f. Each signals Vf1, Vf2 is in the low level when the current of the vertical MOSFET 2, 3 change from negative to approximately 0. The signals Vf1, Vf2 have a high level when the currents change from negative to approximately 0.

Based on the signals Vg1-p, Vg2-p, the power supply control signal generation element 6g senses which of the Hi-MOSFET 2 and the Lo-MOSFET 3 is switched from the off state into the on state and identifies which of the Hi-MOSFET 2 and the Lo-MOSFET 3 is involved in the reverse recovery phenomenon while remaining in the off state. In addition, the power supply control signal generation element 6g senses a direction of the current flowing through the inductor L. The power supply control signal generation element 6g, respectively, outputs the signals Vp1 and Vp2 to control the states of the MOSFETs 2 and 3, the states including the off state and the on state.

Figure 3:
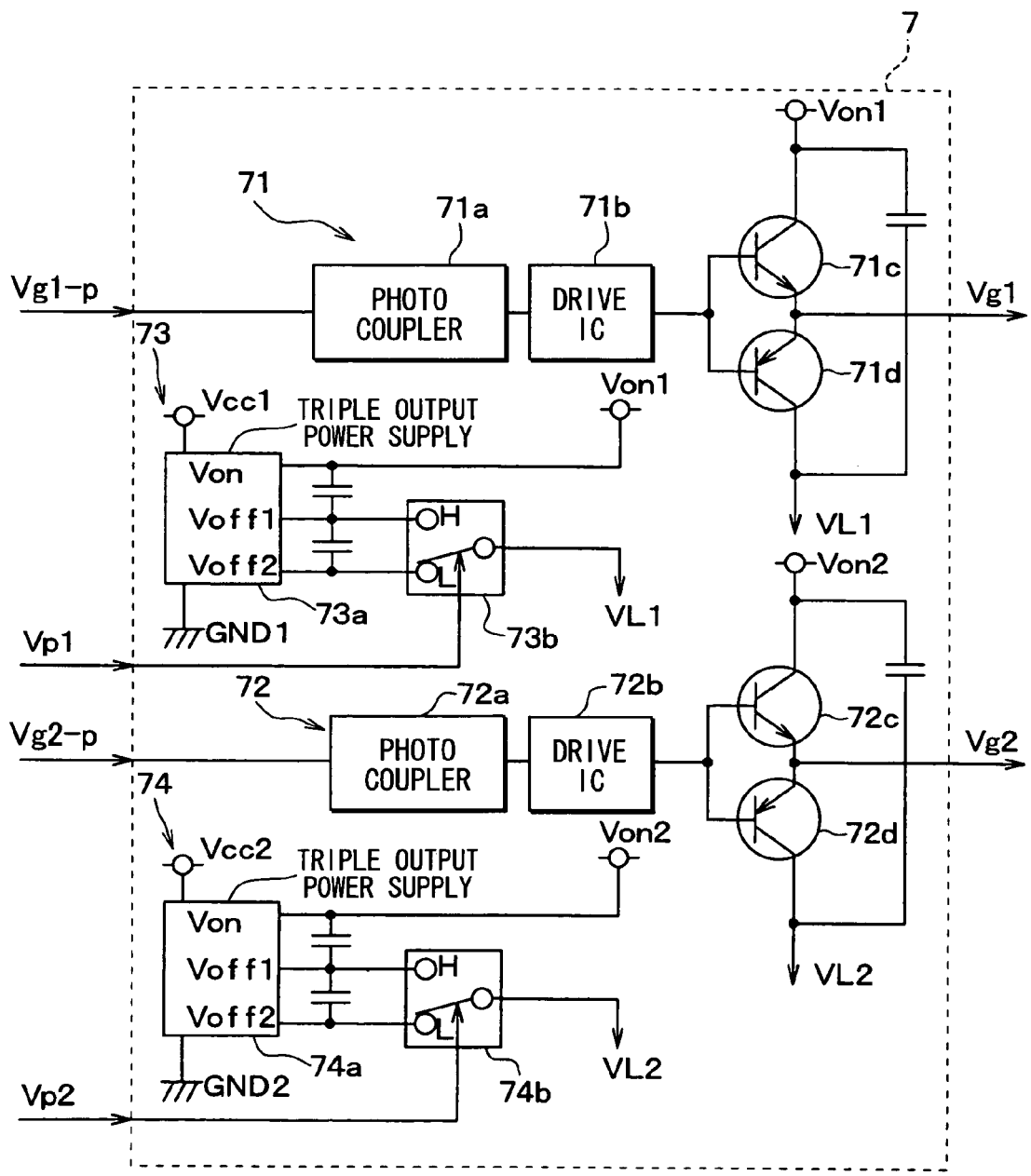
FIG. 3 is a schematic circuit diagram illustrating a gate drive circuit unit shown in FIG. 1.

As shown in FIG. 3, the gate drive circuit unit 7 includes a first gate drive circuit element 71 and a second gate drive circuit element 72. Each gate drive circuit element 71, 72 includes a photocoupler 71a, 72a, a drive IC 71b, 72b as drivers, and a push-pull circuit. Each push-pull circuit includes two complementary bipolar transistors 71c, 71d, 72c, 72d. The gate signals Vg1-p and Vg2-p are input to the first and second gate drive circuit elements 71, 72, respectively. The first gate drive circuit element 71 outputs the gate signal Vg1 to the Hi-MOSFET 2. The second gate drive circuit element 72 outputs the gate signal Vg2 to the Lo-MOSFET 3.

In the first gate drive circuit element 71, a high side potential of the push-pull circuit corresponds to a voltage Von1 and a low side potential of the push-pull circuit corresponds to an off voltage VL1. The voltages Von1, VL1 are developed in a first power supply circuit 73. In the second gate drive circuit element 72, a high side potential of the push-pull circuit corresponds to a voltage Von2 and a low side potential of the push-pull circuit corresponds to an off voltage VL2. The voltages Von2, VL2 are developed in a second power supply circuit 74. The first power supply circuit 73 includes a triple output power supply 73a and a Voff switch 73b. The second power supply circuit 74 includes a triple output power supply 74a and a Voff switch 74b. The triple output power supply 73a can output three output voltages Von, Voff1, Voff2 based on a power supply voltage Vcc1. The triple output power supply 74a can output three output voltages Von, Voff1, Voff2 based on a power supply voltage Vcc2. Each Voff switch 73b, 74b is configured to switch and select an output voltage between Voff1 and Voff2. The output voltages Von output from the triple output power supplies 73a and 74a are used as the voltages Von1 and Von2, respectively. Each voltage Von1, Von2 provides the high-side potential of the push-pull circuit. The output voltages selected by the Voff switches 73b and 74b are used as the off Voltages VL1 and VL2, respectively. Each off Voltage VL1, VL2 provides a low-side potential of the push-pull circuit.

More specifically, the output voltage Von corresponds to the gate voltage of each MOSFET 2, 3 when the MOSFET 2, 3 is in an on state. The output voltage Voff1 corresponds to the gate voltage of each MOSFET 2, 3 when the MOSFET 2, 3 is in a first off mode, which is one of modes in the off state of the vertical type MOSFET 2, 3. The output voltage Voff2 corresponds to the gate voltage of each MOSFET 2, 3 when the MOSFET 2, 3 is in a second off mode. The off state of each MOSFET 2, 3 includes two modes, that is, the first off mode and the second off mode. The Voff switch 73b selects the output voltage Voff1 when the signal Vp1 is in the high level. The Voff switch 74b selects the output voltage Voff1 when the signal Vp2 is in the high level. The Voff switch 73b selects the output voltage Voff2 when the signal Vp1 is in the low level. The Voff switch 74b selects the output voltage Voff2 when the signal Vp2 is in the low level. A magnitude relation between the above voltages is set and described as Von>Voff1>Voff2. A relation Voff2<Vth may be further set, where the Vth is a threshold voltage of the vertical type MOSFET 3. It may be possible to simplify the first and second power supply circuits 73, 74 when a relation Von+Voff2=0 [V] and a relation Voff1=0 [V] are satisfied. For example, the voltages are Von=10 [V], Voff1=0 [V], and Voff2=−10 [V].

The Voff switches 73b and 74b may mechanically function. Alternatively, the Voff switches 73b and 74b may be provided by semiconductor elements. In respects of switching speed and chattering, the semiconductor element may be suitable.

Operations performed by the half bridge circuit 1 and the controller are described below. A timing to switch on the Lo-MOSFET 3 after the dead time and a timing for the reverse recovery phenomenon to occur in the Hi-MOSFET 2 are explained below with reference to a case where the current flowing through the inductor L is directed to the line between the two vertical type MOSFET 2, 3. An arrow shown in FIG. 1 corresponds to the above-described direction of the current.

Figure 4:
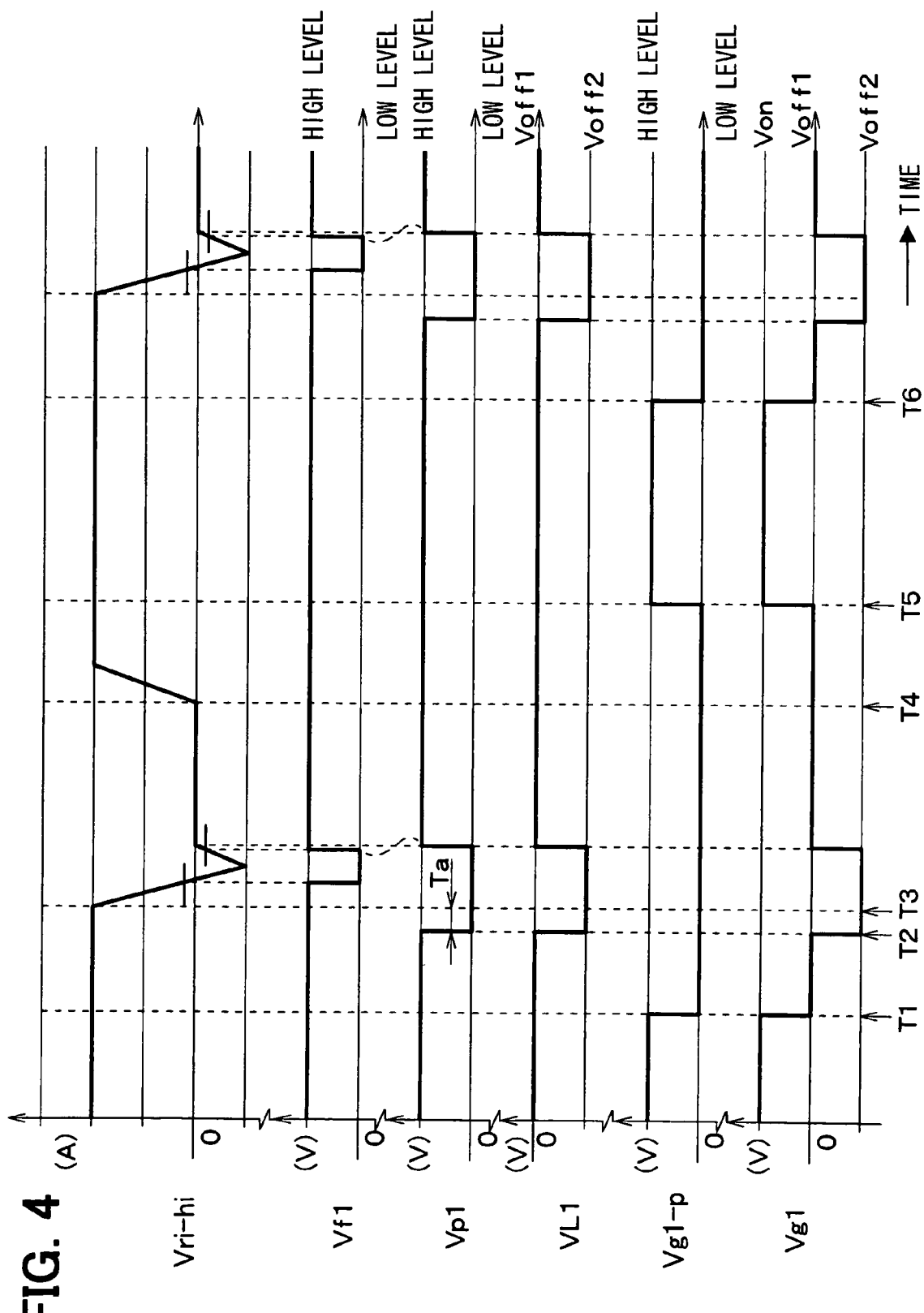
FIG. 4 is a timing chart illustrating representative waveforms of signals associated with the half bridge circuit and the controller shown in FIG. 1.
Figure 5:
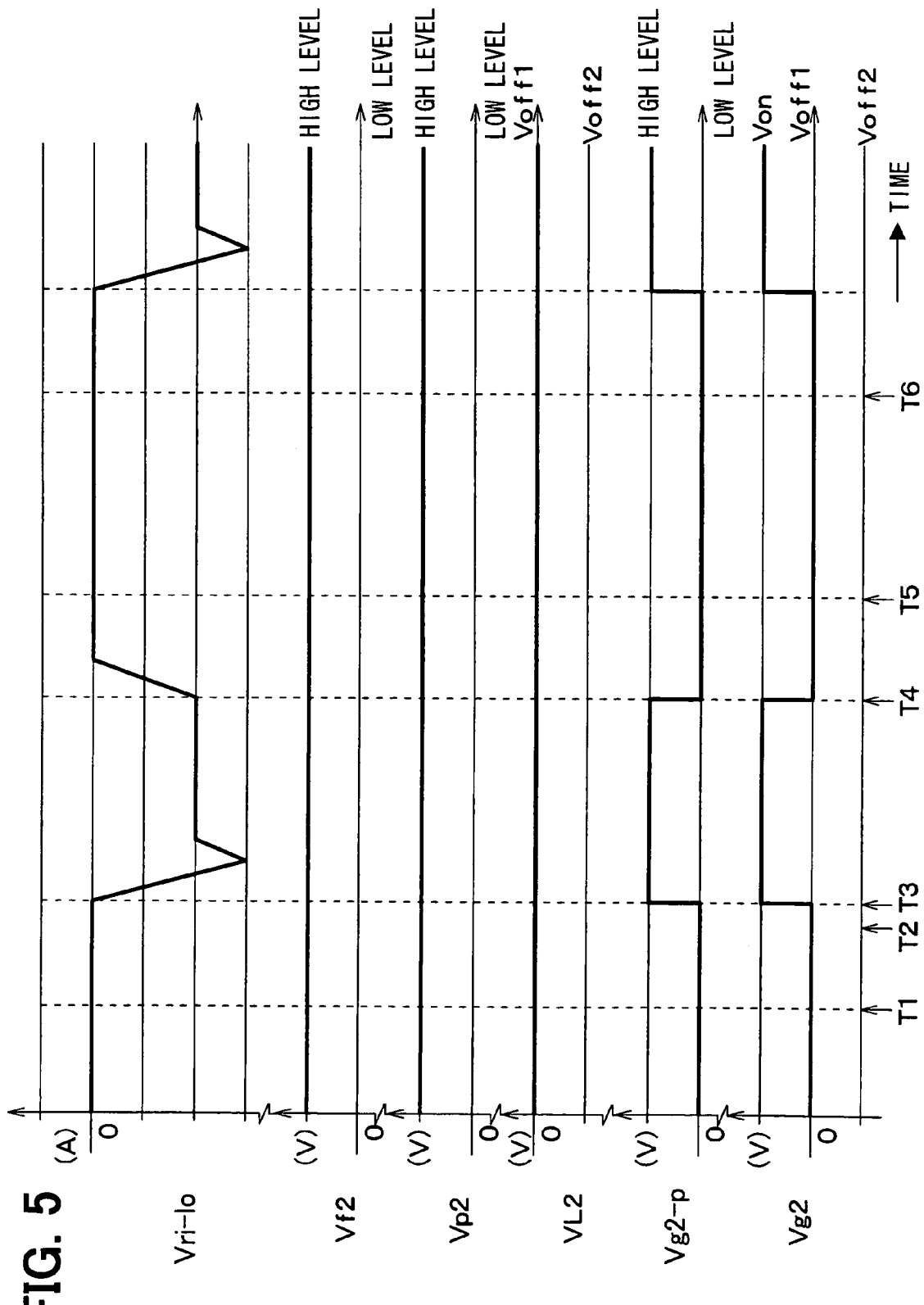
FIG. 5 is a timing chart illustrating representative waveforms of other signals associated with the half bridge circuit and the controller shown in FIG. 1.

FIGS. 4 and 5 are timing charts illustrating waveforms of signals when the half bridge circuit 1 and the controller are in operation.

When the signal Vg1-p is switched from the high level into the low level at a time T1: the power supply control signal generation element 6g determines that one of the MOSFETs 2, 3 to switch from the off state into the on state next time is the Lo-MOSFET 3 based on histories of level changes of the signals Vg1-p and Vg2-p; the power supply control signal generation element 6g determines, based on the signals Vf1 and Vf2, that the current flowing through the inductor L is directed to the line between the two vertical type MOSFETs 2, 3; and the power supply control signal generation element 6g identifies that the reverse recovery phenomenon is to occur in the Hi-MOSFET 2.

During the dead time, corresponding to after the time T1, the power supply control signal generation element 6g outputs the signal Vp1 with the high level, the Voff switch 73b of the first gate drive circuit element 71 switches to select the output voltage Voff1, and thereby, the off voltage VL1 corresponds to the output voltage Voff1. The output voltage Voff1 is thereby applied to the Hi-MOSFET 2 so that the gate voltage of the Hi-MOSFET 2 corresponds to the output Voltage Voff1. The Hi-MOSFET 2 accordingly switches into the first off mode. In the above case, the power supply control signal generation element 6g also outputs the signal Vp2 with the high level. The Voff switch 74b of the second gate drive circuit element 72 switches to select the output voltage Voff1, and the off voltage VL2 corresponds to the output voltage Voff1. The output voltage Voff1 is applied to the Lo-MOSFET 3 so that the gate voltage of the Lo-MOSFET 3 corresponds to the output Voltage Voff1. As a result, the Lo-MOSFET 3 also switches into the first off mode.

Here, explanation on the first off mode is given with reference to FIG. 15. The off state of each MOSFET includes the first off mode and the second off mode. In the first off mode, the gate voltage of the MOSFET 2, 3 corresponds to or is approximately equal to the output voltage Voff1. When the gate voltage of each MOSFET 2, 3 is approximately equal to the output voltage Voff1, the forward voltage of the built-in diode 2a, 3a of the MOSFET 2, 3 is controlled so that the forward voltage of the built-in diode 2a, 3a is approximately equal to the first forward voltage Vf1. In the first off mode, the first forward voltage Vf1 of the built-in diode 2a, 3a is smaller than a below-described second forward voltage Vf2. A current is therefore easier to flow through the built-in diode 2a, 3a. For this reason, a relatively small current flows through the external diode D1, D2 in the first off mode, which reduces power loss in the external diode D1, D2.

At a time T2, the power supply control signal generation element 6g outputs the signal Vp1 with the low level. The Voff switch 73b of the first gate drive circuit element 71 accordingly switches to select the output voltage Voff2 so that the off voltage VL1 corresponds to the output voltage Voff2. The output voltage Voff2 is thereby applied to the Hi-MOSFET 2. As a result, the gate voltage of the Hi-MOSFET 2 corresponds to the output Voltage Voff2. The Hi-MOSFET 2 switches into the second off mode. A timing (i.e., T2) to switch the output voltage from Voff1 to Voff2 by the Voff switch 73b is set based on preliminary-performed experiments. More specifically, a period Ta is preliminary determined, the period Ta being required to change the gate voltage from that corresponding to Voff1 to that corresponding to Voff2 when a gate capacitance of the Hi-MOSFET 2 is charged with the gate voltage. The time T2 is set to a time which is more than the period Ta before the time T3.

Here, explanation on the second off mode is given with reference to FIG. 15. The off state of each MOSFET 2, 3 includes the first off mode and the second off mode. In the second off mode, the gate voltage of the vertical type MOSFET 2, 3 corresponds to or is approximately equal to the output voltage Voff2. When the gate voltage of each MOSFET 2, 3 is approximately equal to the output voltage Voff2, the forward voltage of the built-in diode 2a, 3a of the MOSFET 2, 3 is controlled so that the forward voltage of the built-in diode 2a, 3a is approximately equal to the second forward voltage Vf2. In the second off mode, the forward voltage of the built-in diode 2a, 3a is controlled so that the second forward voltage Vf2 of the built-in diode 2a, 3a is larger than above-described first forward voltage Vf1. A current is therefore harder to flow through the built-in diode 2a, 3a. As a result, a relatively larger current flows through the external diode D1, D2, and it is therefore possible to improve a reverse recovery characteristic in the second off mode. Moreover, by switching into the second off mode, it is possible to suppress a self turn-on phenomenon, in which the gate voltage instantaneously exceeds a threshold voltage in switching.

At a time T3, the output voltage Von is applied to the gate of the Lo-MOSFET, and the Lo-MOSFET 3 switches into the on state. At a substantially same time T3, the period of the Lo-MOSFET 3 being in the on state starts. Due to the above changes, the reverse recovery phenomenon occurs. At the time T3, the voltage signal Vri-hi starts to change from positive to negative, and accordingly, the comparator 6e of the PWM waveform generation unit 6 outputs the signal Vf1 with the low level. The voltage signal Vri-hi is converted from the current detected by the current detection unit 5a, 5b provided in a side of the Hi-MOSFET 2. After the reverse recovery phenomenon ends, the voltage signal Vri-hi changes from negative to approximately zero, and the signal Vf1 output from the comparator 6e is switched into the high level.

The power supply control signal generation element 6g detects a rising edge of the signal Vf1, the rising edge corresponding to a change of the signal Vf1 from the low level to the high level. The power supply control signal generation element 6g thereby detects an end of the reverse recovery phenomenon and outputs the signal Vp1 with the high level. The Voff switch 73b of the first gate drive circuit element 71 switches to select the output voltage Voff1 so that the off voltage VL1 corresponds to the output voltage Voff1. The voltage Voff1 is applied to the gate of the Hi-MOSFET 2, and thus, the Hi-MOSFET 2 switches in the first off mode. The forward voltage of the built-in diode 2a is controlled to be the first forward voltage Vf1.

At a time T4, a period of the Lo-MOSFET 3 being in the on state ends, and the dead time starts. The power supply control signal generation element 6g outputs the signal Vp2 with the high level, the Voff switch 74b of the second gate drive circuit element 72 switches to select the output voltage Voff1 so that the off voltage VL2 corresponds to the output voltage Voff1. The output voltage Voff1 is thereby applied to the gate of the Lo-MOSFET 3. The Lo-MOSFET 3 accordingly switches into the first off mode.

At a time T5, the output voltage Von is applied to the gate of the Lo-MOSFET so that the gate voltage corresponds to the output voltage Von, and thereby, the Lo-MOSFET 3 switches into the on state to start a period, in which the Lo-MOSFET 3 is in the on state. It should be note that a reverse recovery phenomenon may not occur at the time T5 since a current flows to the power supply E via the external diode to regenerate. In the above case, since the voltage signal Vri-lo does not change and remains in zero, the signal Vf2 output from the comparator 6f of the PWM waveform generation element 6 accordingly remains in the high level.

At a time T6, the period of the Hi-MOSFET 2 being in the on state ends, and the dead time starts. The power supply control signal generation element 6g outputs the signal Vp1 with the high level. The Voff switch 73b of the first gate drive circuit element 71 switches to select the output voltage Voff1 so that the off voltage VL1 corresponds to the output voltage Voff1. The output voltage Voff1 is thereby applied to the gate of the Hi-MOSFET 2 The Hi-MOSFET 2 accordingly switches into the first off mode.

As long as the direction of current flowing through the inductor L remains in the above-described direction, the MOSFETs 2, 3 continue to operate to repeat a period between T1 and T6.

When the direction of the current flowing through the inductor L is opposite to that in the above-described case, the reverse recovery phenomenon occurs in the Lo-MOSFET 3, and the Hi-MOSFET 2 switches between on and off, which combination is different from the above-described case. The power supply control signal generation element 6g performs such an operation that the level changes of the relevant signals shown in FIGS. 4, 5 as well as the signals Vri-hi and the Vril-lo are replaced between the two current direction cases.

Figures 16, 17:
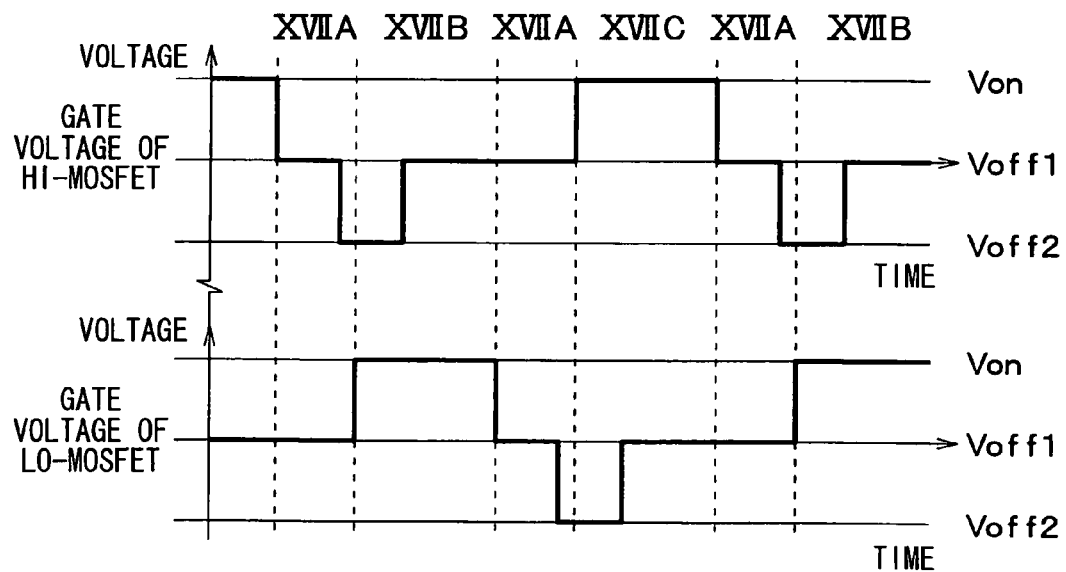
FIG. 16 is a table showing in which MOSFET reverse recovery phenomenon occurs and which MOSFET switches on and off, depending on a direction of a current flowing through a inductor.
FIG. 17 is a timing chart illustrating a representative waveform of a gate signal for a Hi-MOSFET and a representative waveform of a gate signal for a Lo-MOSFET according to a modified embodiment.

Depending on the direction of the current flowing through the inductor L, the reverse recovery phenomenon occurs in one of the MOSFETs 2, 3, and the other of the MOSFETs 2, 3 is switched between on and off. Combinations of an occurrence of the reverse recovery phenomenon and switching on and off are shown in FIG. 16.

Figure 6:
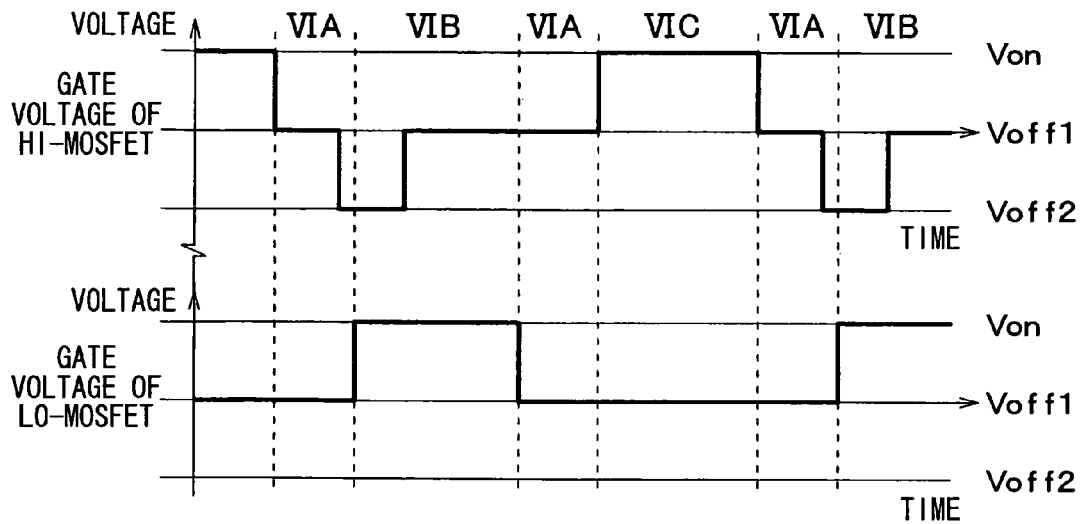
FIG. 6 is a timing chart illustrating a representative waveform of a gate signal for a Hi-MOSFET and a representative waveform of a gate signal for a Lo-MOSFET according to a first embodiment.
Figure 7:
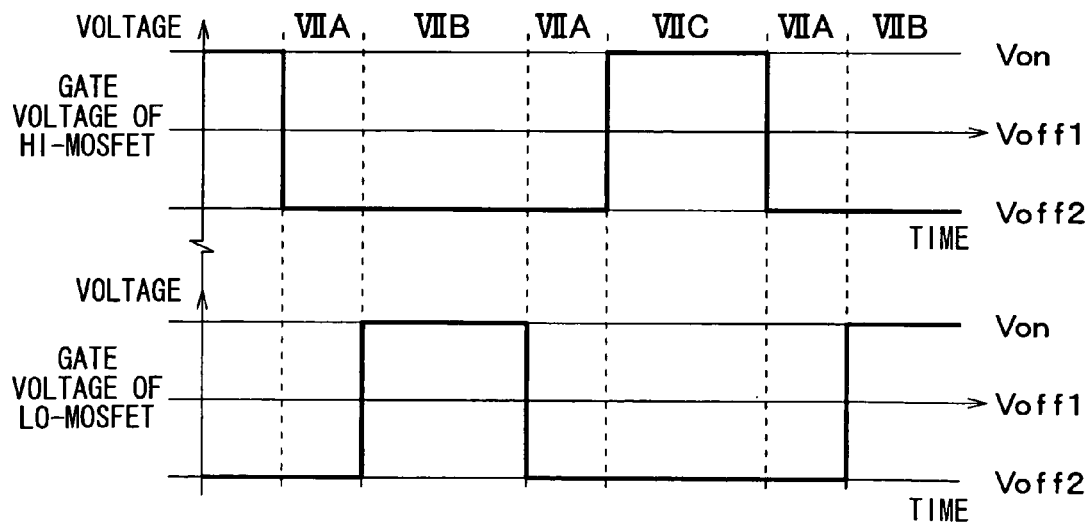
FIG. 7 is a timing chart illustrating waveform of gate signals for MOSFETs according to the related art.

FIG. 6 is a timing chart illustrating waveform of the gate signal Vg1 input to the Hi-MOSFET 2 and waveform of the gate signal Vg2 input to the Lo-MOSFET 3. For comparison, a timing chart illustrating waveform of a gate signal according to the related art are shown in FIG. 7. In FIG. 6, a symbol VIA shows the dead time, a symbol VIB shows the period of the Lo-MOSFET being in the on state, and a symbol VIC shows the period of the Hi-MOSFET being in the on state. In FIG. 7, a symbol VIIA shows the dead time, a symbol VIIB shows the period of the Lo-MOSFET being in the on state, and a symbol VIIC shows the period of the Hi-MOSFET being in the on state.

According to the related art as is shown in FIG. 7, during the dead time, one of a Hi-MOSFET and a Lo-MOSFET is in the off state and the other of the MOSFETs is to switch into the on state. The gate signal, which is input to the one of the MOSFETs, indicates an output voltage Voff2 in order to suppress an occurrence of the self turn-on in switching. The one of the MOSFETs is in the second off mode during the dead time.

According to the present embodiment, unlike the related art, one of the gate signals Vg1 and Vg2 indicates the output voltage Voff1, and thereby, one of the Hi-MOSFET 2 and the Lo-MOSFET 3 is in the first off mode during an early time of the dead time. Consequently, a comparatively small current flows through the external diode D1, D2, which results in reduction of power loss due to a flow of a large current through the external diode D1, D2.

When the reverse recovery phenomenon occurs in one of the Hi-MOSFET 2 and the Lo-MOSFET 3 prior to a time when the other of the MOSFETs 2, 3 is switched on, the gate signal Vg1, Vg2 for the other of the MOSFETs 2, 3 is switched into the output voltage Voff2; thereby, the other of the MOSFETs 2, 3 is switched into the second off mode. As a result, a comparatively large current flows through the external diodes D1, D2, which improves a reverse recovery characteristic. Moreover, by switching into the second off mode, it is possible to suppress the self turn-on phenomenon, in which the gate voltage instantaneously exceeds the threshold voltage in switching.

As explained above, according to the present embodiment, it is possible to reduce power loss in the built-in diode and restrict occurrences of the reverse recovery phenomenon and the self turn-on. Further, it is possible to achieve the above advantages without using a reverse blocking diode. It is therefore possible to restrict an increase in an on-state resistance of the MOSFETs, complication of a circuit, and enlargement of the circuit.

Second Embodiment

A controller of a half bridge circuit 1 and the half bridge circuit 1 including vertical type MOSFETs according to a second embodiment is described below. FIG. 1 is a circuit diagram also illustrating the controller of the half bridge circuit 1 and the half bridge circuit 1 according to the second embodiment. A timing to switch on the Lo-MOSFET 3 after the dead time and a timing for the reverse recovery phenomenon to occur in the Hi-MOSFET 2 are explained below with reference to a case where the current flowing through the inductor L is directed to the line between the two vertical type MOSFET 2, 3. The arrow shown in FIG. 1 corresponds to the above-described direction of the current.

Figure 8:
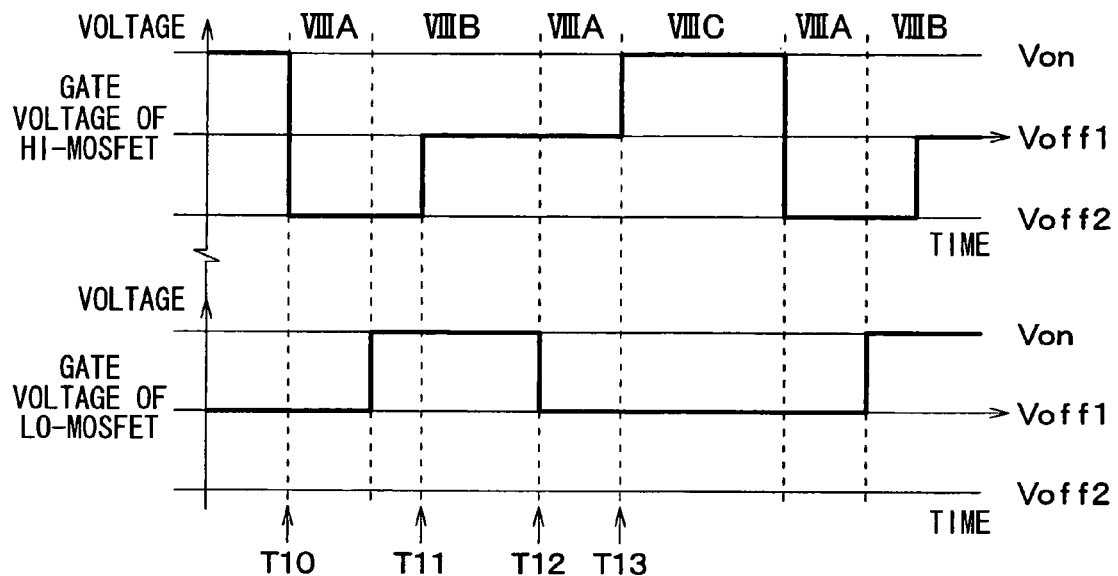
FIG. 8 is a timing chart illustrating a representative waveform of a gate signal for a Hi-MOSFET and a representative waveform of a gate signal for a Lo-MOSFET according to a second embodiment.

FIG. 8 is a timing chart according to the present embodiment, the timing chart illustrating a representative waveform of the gate signal Vg1 for the Hi-MOSFET 2 and a representative waveform of the gate signal Vg2 for the Lo-MOSFET 3. In FIG. 8, a symbol VIIIA shows the dead time, a symbol VIIIB shows a period of the Lo-MOSFET being in the on state, and a symbol VIIIC shows a period of the Hi-MOSFET being in the on state.

The waveforms of the gate signals Vg1, Vg2 for the Hi-MOSFET 2 and the Lo-MOSFET 3 shown in FIG. 8 according to the present embodiment are different from that shown in FIG. 6 according to the first embodiment.

More specifically, as shown in FIG. 8, at an early time during the dead time, that is, after switching off the Hi-MOSFET 2, the output voltage Voff2 is applied to the gate of the Hi-MOSFET 2.

Although the above manner may simplify control of the gate voltages, advantages according to the present embodiment are substantially identical to that according to the first embodiment. In the present embodiment, the Hi-MOSFET 2 is not switched into the first off mode but the second off mode at the early time of the dead time. Thus, it might be considered that an advantage associated with reduction of diode power loss for a case of switching the Hi-MOSFET 2 into the first off mode is not constantly provided. However, since the Hi-MOSFET 2 is switched into the first off mode after a time T11, that is, after the reverse recovery current is approximately zero, it is possible to reduce the diode power loss at least during a period between a time T12 and a time T13. The time T12 corresponds to a time when the Lo-MOSFET 3 is switched into the off state from the on state. The time T13 corresponds to a time the Hi-MOSFET 2 is switched on again.

The above-described control capability is provided by changing control timings according to the first embodiment in respects of switching of the output voltages Voff1, Voff2. According to embodiments, the power supply control signal generation element 6g of the PWM waveform generation unit 6 outputs the signals Vp1, Vp2. According to the first embodiment, the signals Vp1, Vp2 are switched from the high level into the low level at the predetermined time, which is preliminarily determined by experiments. In addition, the output voltages output from the first and second power supply circuit 73, 73 are accordingly switched from Voff1 to Voff2. According to the present embodiment, the signals Vp1, Vp2 output from the power supply control signal generation element 6g are switched from the high level into the low level when the signals Vg1-p, Vg2-p are switched from the high level into the low level.

Third Embodiment

A controller of a half bridge circuit 1 and the half bridge circuit 1 including vertical type MOSFETs according to a third embodiment is described below. FIG. 1 is a circuit diagram also illustrating the controller of the half bridge circuit 1 and the half bridge circuit 1 according to the third embodiment.

Figure 9:
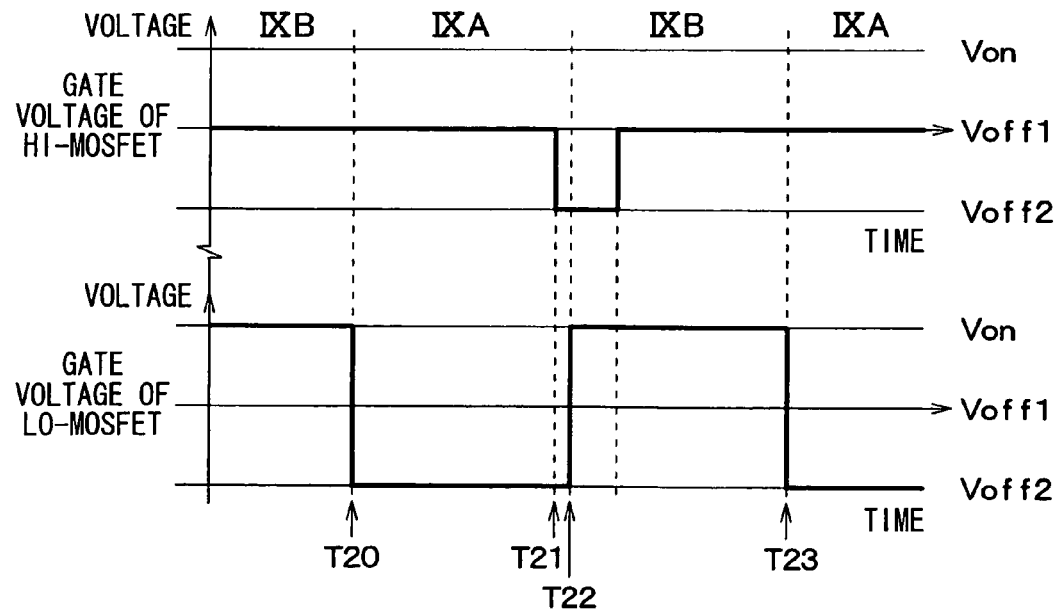
FIG. 9 is a timing chart illustrating a representative waveform of a gate signal for a Hi-MOSFET and a representative waveform of a gate signal for a Lo-MOSFET according to a third embodiment.
Figure 10:
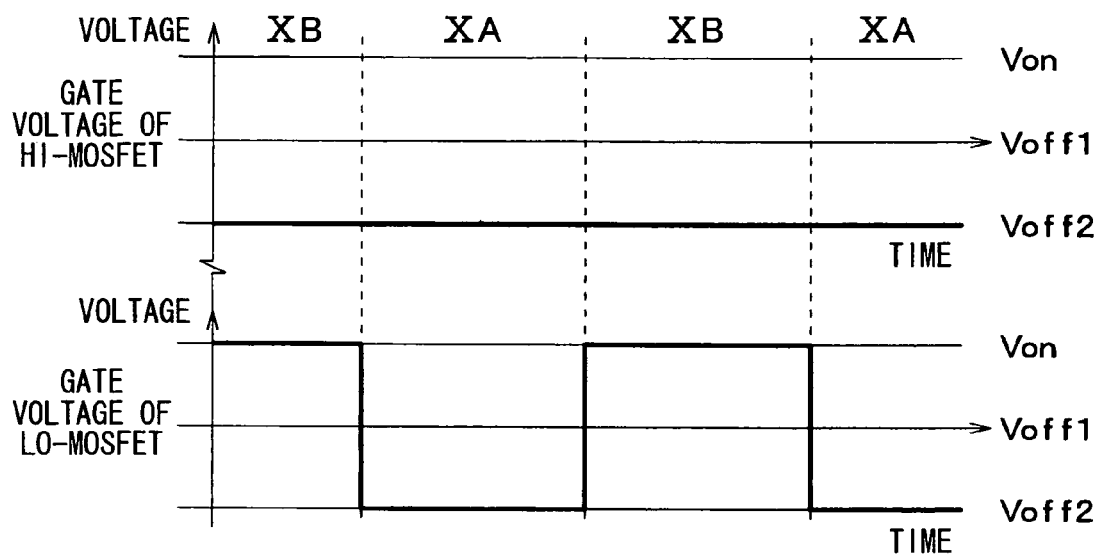
FIG. 10 is a timing chart illustrating a representative waveform of a gate signal for a Hi-MOSFET and a representative waveform of a gate signal for a Lo-MOSFET according to the related art.

A timing chart according to the present embodiment is shown in FIG. 9, which illustrates a representative waveform of the gate signal Vg1 of the Hi-MOSFET 2 and a representative waveform of the gate signal Vg2 of the Lo-MOSFET 3. For comparison, a timing chart illustrating waveforms of gate signals Vg1, Vg2 according to the related art is shown in FIG. 10. In FIG. 9, a symbol IXA shows a period of the Lo-MOSFET being in the off state, and a symbol IXB shows a period of the Lo-MOSFET being in the on state. In FIG. 10, a symbol XA shows a period of the Lo-MOSFET being in the off state, and a symbol XB shows a period of the Lo-MOSFET being in the on state.

As shown in FIG. 9, the Lo-MOSFET 3 is repeatedly switched between on and off while the Hi-MOSFET 2 remains in the off state. According to the related art as shown in FIG. 10, the gate voltage of the Lo-MOSFET 3 is repeatedly switched between Von and Voff2 in accordance with the gate signal Vg2 while the gate voltage of the Hi-MOSFET 2 remains in Voff2.

According to the present embodiment, when the Lo-MOSFET 3 is in the on state, the output voltage Von is applied to the gate of the Lo-MOSFET 3. When the Lo-MOSFET is in the second off mode, which is included in the off state, the output voltage Voff2 is applied to the gate of the Lo-MOSFET 3. At a time T21, that is, at a time before the Lo-MOSFET 3 is switched into the on state from off state, the output voltage applied to the gate of the Hi-MOSFET 2 is switched from Voff1 to Voff2. At a time T23, that is, at a time after the Lo-MOSFET is switched from the off state into the on state, the reverse recovery phenomenon ends. Then, the output voltage applied to the gate of the Hi-MOSFET 2 is switched from Voff2 to Voff1.

According to the above manners, it is possible to improve reverse recovery characteristics when the Lo-MOSFET 3 is switched from the off state into the on state. Further, it is possible to restrict an occurrence of the self turn-on phenomenon. Moreover, since the output voltage Voff1 is applied to the gate of the Hi-MOSFET 2 as the gate voltage after the reverse recovery phenomenon ends, it is possible to reduce power loss in the diode of the Hi-MOSFET 2 during the Lo-MOSFET is in the off state.

A timing to switch the Lo-MOSFET 3 from the off state into the on state and a timing for the reverse recovery phenomenon to occur in the Hi-MOSFET 2 are explained below with reference to a case where the current flowing through the inductor L is directed to the line between the two vertical type MOSFET 2, 3. The arrow shown in FIG. 1 corresponds to the reference direction of the current.

When the signal Vg1-p is switched from the high level into the low level at a time T20: the power supply control signal generation element 6g determines that one of the MOSFETs 2, 3 to switch from the second off mode into the on state next time is the Lo-MOSFET 3, based on histories of level changes of the signals Vg1-p and Vg2-p; and the power supply control signal generation element 6g identifies that the reverse recovery phenomenon is to occur in the Hi-MOSFET 2.

During a period from the time T20, the Lo-MOSFET 3 is in the second off mode and the power supply control signal generation element 6g outputs the signal Vp2 with the low level. Thereby, the Voff switch 74b of the second gate drive circuit element 72 is switched to select the output voltage Voff2. As a result, the output voltage Voff2 corresponds to the off voltage VL2. The output voltage Voff2 is thus applied to the gate of the Lo-MOSFET 3 so that the gate voltage of the Lo-MOSFET 3 corresponds to the output voltage Voff2. The Lo-MOSFET 3 accordingly switches into the second off mode. The power supply control signal generation element 6g outputs the signal Vp1 with the high level. Thereby, the Voff switch 73b of the first gate drive circuit element 71 switches to select the output voltage Voff1 so that the off voltage VL1 corresponds to the output voltage Voff1. The output voltage Voff1 is thereby applied to the Hi-MOSFET 2 so that the gate voltage of the Hi-MOSFET 2 corresponds to the output voltage Voff1. The Hi-MOSFET 2 accordingly switches into the first off mode.

At a time T21, the power supply control signal generation element 6g outputs the signal Vp1 with the low level. The Voff switch 73b of the first gate drive circuit element 71 switches and selects the output voltage Voff2 so that the off voltage VL1 corresponds to the output voltage Voff2. The output voltage Voff2 is thereby applied to the gate of the Hi-MOSFET 2. The Hi-MOSFET 2 accordingly switches into the second off mode. In the above case, the timing associated with switching the output voltage from Voff1 to Voff2 by the Voff switch 73b is preliminary determined based on experiments, which determination based on the experiments is similar to the first embodiment.

At a time T22, the output voltage Von is applied to the gate of the Lo-MOSFET so that the gate voltage corresponds to the output voltage Von, and thereby, the Lo-MOSFET 3 switches into the on state at a substantially same time when starting the period of the Lo-MOSFET 3 being in the on state. Due to the above changes, the reverse recovery phenomenon occurs. When the reverse recovery phenomenon occurs, the voltage signal Vri-hi starts to change from positive to negative, and accordingly, the comparator 6e of the PWM waveform generation unit 6 outputs the signal Vf1 with the low level. The voltage signal Vri-hi is converted from the current detected by the current detection unit 5a, 5b provided in a side of the Hi-MOSFET 2. After the reverse recovery phenomenon finishes, the voltage signal Vri-hi changes from negative to approximately zero, and the signal Vf1 output from the comparator 6e is switched into the high level.

The power supply control signal generation element 6g detects a rising edge of the signal Vf1, the rising edge corresponding to a change of the signal Vf1 from the low level to the high level. The power supply control signal generation element 6g thereby detects an end of the reverse recovery phenomenon and outputs the signal Vp1 with the high level. The Voff switch 73b of the first gate drive circuit element 71 switches and selects the output voltage Voff1 so that the off voltage VL2 corresponds to the output voltage Voff1. The voltage Voff1 is applied to the gate of the Hi-MOSFET 2. The Hi-MOSFET 2 is accordingly switched into the first off mode. The forward voltage of the built-in diodes 2a is controlled to be the first forward voltage Vf1.

At a time T23, a period of the Lo-MOSFET 3 being in the on state ends. The power supply control signal generation element 6g outputs the signal Vp2 with the low level. The Voff switch 74b of the second gate drive circuit element 72 switches to select the output voltage Voff2 so that the off voltage VL2 corresponds to the output voltage Voff2. The output voltage Voff2 is thereby applied to the gate of the Lo-MOSFET 3. The Lo-MOSFET 3 accordingly switches into the second off mode.

As long as the direction of current flowing through the inductor L does not change, the MOSFETs 2, 3 continue to operate such that a period between T20 and T23 is repeatedly provided.

The waveforms VP1, VP2 according to the present embodiment, which are output from the power supply control signal generation element 6g based on the signals Vg1-p, Vg2-p, are different from that according to the first embodiment.

According to the present embodiment, since the dead time is not provided, the dead time generation element 6d shown in FIG. 2 may be provide the dead time as approximately 0 in appropriate time unit. Alternatively, the dead time generation element 6d may not be provided. In this case, the signals Vc1 and Vc2 may be used as Vg1-p and Vg2-p without change.

Fourth Embodiment

A controller of a half bridge circuit 1 and the half bridge circuit 1 including vertical type MOSFETs according to a fourth embodiment is described below.

Figure 11:
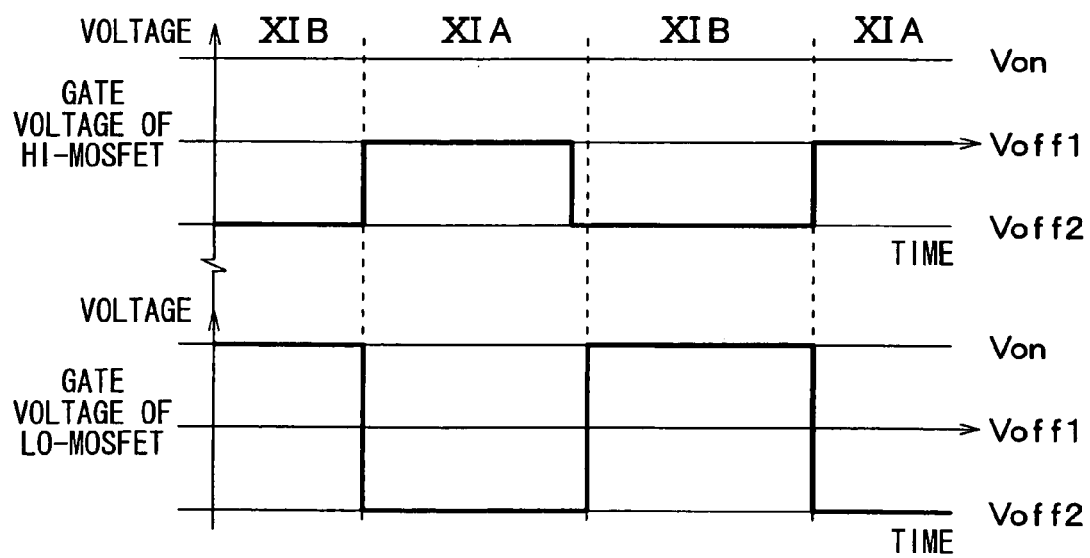
FIG. 11 is a timing chart illustrating a representative waveform of a gate signal for a Hi-MOSFET and a representative waveform of a gate signal for a Lo-MOSFET according to a fourth embodiment.

A timing chart according to the present embodiment is shown in FIG. 11, which illustrates a representative waveform of the gate signal Vg1 for the Hi-MOSFET 2 and a representative waveform of the gate signal Vg2 for the Lo-MOSFET 3. In FIG. 11, a symbol XIA represents a period of the Lo-MOSFET being in the off state, and a symbol XIB represents a period of the Lo-MOSFET being in the on state.

As shown in FIG. 11, the Lo-MOSFET 3 is repeatedly switched between on and off while the Hi-MOSFET 2 remains in the off state.

According to the present embodiment, when the Lo-MOSFET 3 is switched from the on state to the off state, the output voltage applied to the gate of the Lo-MOSFET 3 is switched from Voff2 to Voff1.

According to the above manner, it is possible to improve a reverse recovery characteristic in switching the Lo-MOSFET 3 from the off state into the on state. Also, it is possible to restrict an occurrence of the self-turn on phenomenon. Moreover, since the output voltage applied to the gate of the Hi-MOSFET 2 is switched again to Voff1 when the Lo-MOSFET 3 is switched into the off state from the on state, it is possible to reduce power loss in the diode of the Hi-MOSFET 2 during the Lo-MOSFET is in the off state.

The waveforms of the signals Vp1, Vp2 according to the present embodiment, which are output from the power supply control signal generation element 6g, are different from that according to the third embodiment. According to the third embodiment, the power supply control signal generation element 6g detects the rising edge of the signal Vf1, thereby detects an end of the reverse recovery phenomenon, and outputs the signal Vp1 with the high level. According to the present embodiment, on the other hand, the power supply control signal generation element 6g detects switching of the Lo-MOSFET 3 from the on state into the off state based on the signals Vg1-p, Vg2-p, and the power supply control signal generation element 6g outputs the signal Vp1 with the high level. The Voff switch 73b of the first gate drive circuit element 71 switches to selects the output voltage Voff1 so that the off voltage VL1 corresponds to the output voltage Voff1. The voltage Voff1 is accordingly applied to the gate of the Hi-MOSFET 2 and the forward voltages of the built-in diodes 2a, 3a are controlled to be the first forward voltage Vf1. The Hi-MOSFET 2 switches in the first off mode.

Fifth Embodiment

Figure 12:
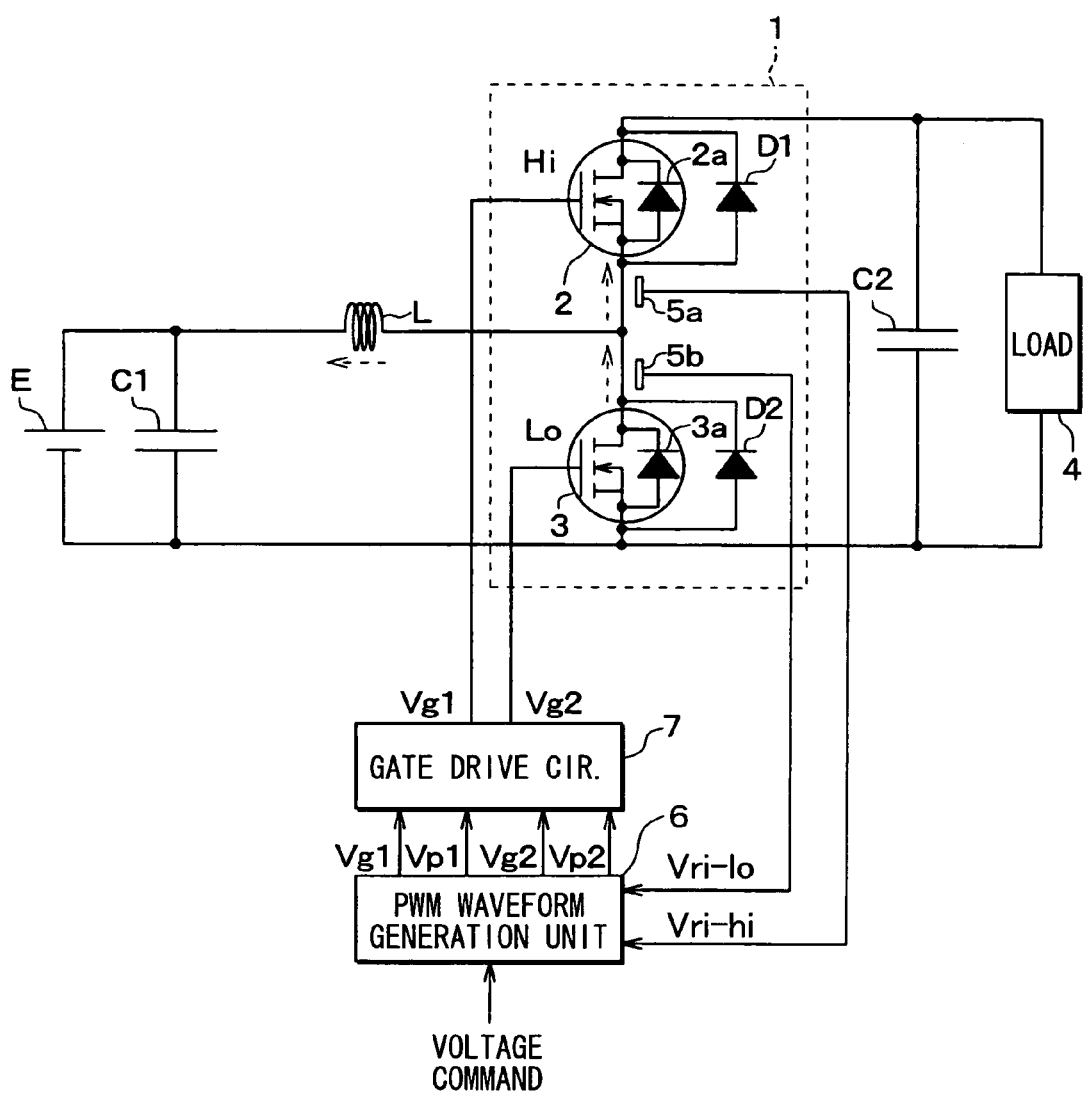
FIG. 12 is a schematic circuit diagram illustrating a half bridge circuit having vertical type MOSFETs and a controller for the half bridge circuit according to a fifth embodiment.

A controller of a half bridge circuit 1 and the half bridge circuit 1 including vertical type MOSFETs according to a fifth embodiment is described below. FIG. 12 is a circuit diagram illustrating a controller of a half bridge circuit 11 and the half bridge circuit 11 including the vertical type MOSFETs 2, 3 according to the present embodiment.

The half bridge circuit 11 according to the present embodiment can be used as, for example, a step-up inverter. The half bridge circuit 11 includes two vertical type MOSFETs 2, 3 connected in series. Both ends of the series-connected two vertical type MOSFETs 2, 3 are connected with the load 4 and a capacitor C1. The input power supply E and the power supply stabilization capacitor C1 are connected to the line between the two vertical type MOSFETs 2, 3 through the inductor L. The load 4 is driven by alternately switching the two vertical type MOSFETs 2 and 3 between on and off.

According to the above circuit configuration, it is possible to perform operations that are substantially identical to that according to the first to fourth embodiments. The half bridge circuit 11 and the controller according to the present embodiment provide advantages that are substantially identical to that according to the first to fourth embodiments.

Sixth Embodiment

Figure 13:
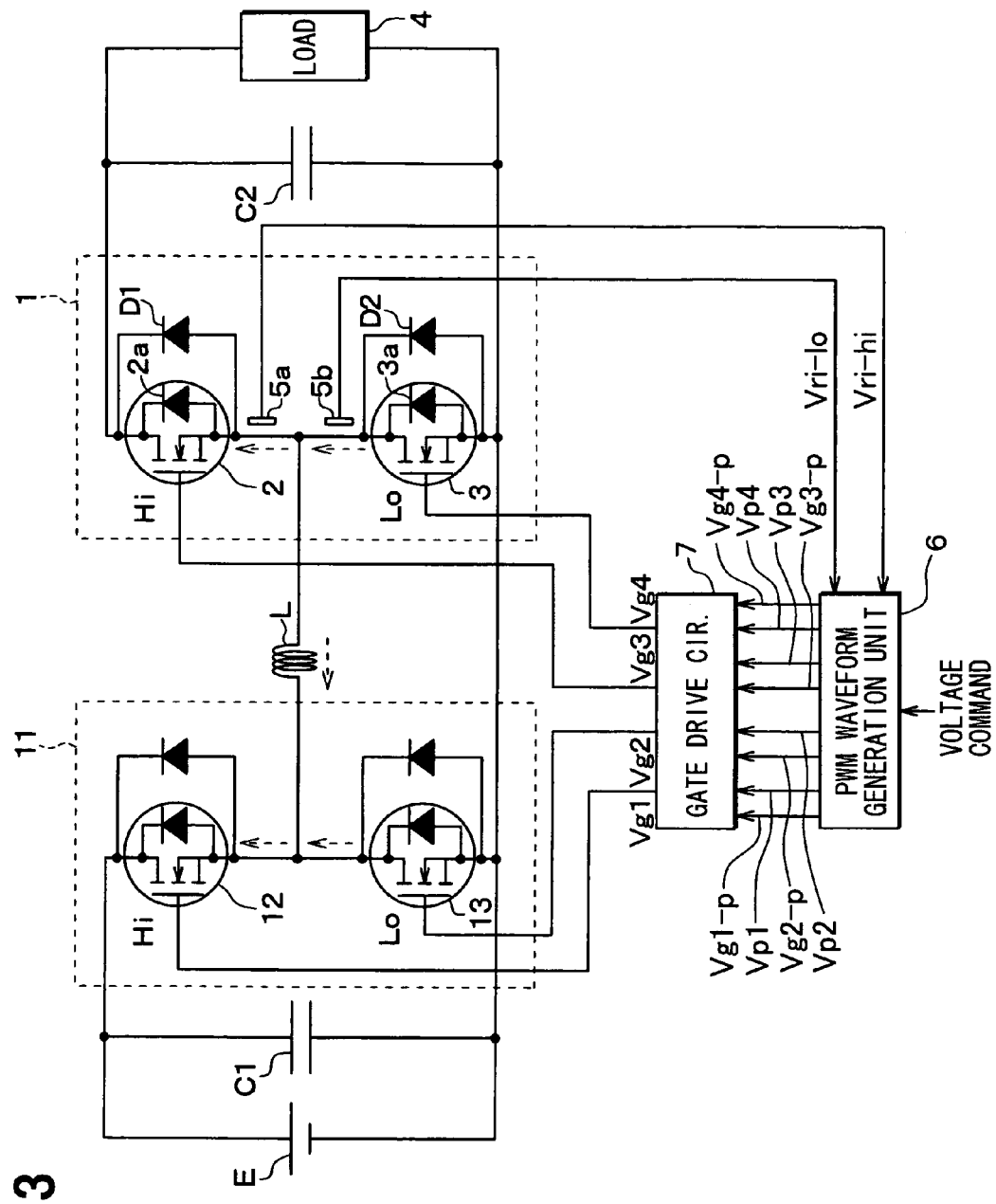
FIG. 13 is a schematic circuit diagram illustrating a full bridge circuit having vertical type MOSFETs and a controller for the full bridge circuit according to a six embodiment.

A controller of a full bridge circuit and the full bridge circuit including vertical type MOSFETs according to a sixth embodiment are described below with reference to FIG. 13. The full bridge circuit may be used for driving a load and includes the half bridge circuit 1 and the half bridge circuit 11 connected with each other. Each half bridge circuit 1, 11 includes two vertical type MOSFETs connected in series.

The full bridge circuit may be used as a step-up/step-down inverter. The half bridge circuit 1 and the half bridge circuit 11 may, respectively, provide a step-up inverter and a step-down inverter. The input power supply E and a power supply stabilization capacitor C1 are connected with both ends of the series-connected two vertical type MOSFETs 12, 23 in the half bridge circuit 11. The load 4 and the capacitor C2 are connected with both ends of the series-connected two vertical type MOSFETs 2, 3 in the half bridge circuit 1. A line between the two MOSFETs 2, 3 in the half bridge circuit 1 is connected with a line between the two MOSFETs 12, 13 in the half bridge circuit 11 via the inductor L.

According to the above configuration, each half bridge circuit 1, 11 is capable of performing operations substantially identical to that according to the first and fourth embodiments. Depending on a direction of a current flowing through the inductor L, it is possible to distinguish a MOSFET in which the reverse recovery phenomenon occurs as well as a MOSFET which is switched between on and off. The load is capable of being driven. Therefore, advantages according to the present embodiment include the advantages according to the first to fourth embodiments. Behaviors of the Hi-MOS- FET and the Lo-MOSFET of each half bridge circuit 1, 11 in the full bridge circuit are shown in FIG. 16.

Modified Embodiments

In the above embodiments, a period of the reverse recovery phenomenon is determined based on detection results of the current detection units 5a, 5b. Alternatively, the period may be preliminarily determined based on experiments since the reverse recovery phenomenon may have a typical period. More specifically, the period may be preliminarily set based on a time for a reverse recovery current flowing through a drain-source of the MOSFET 2, 3 to be approximately zero, the reverse recovery current being assumed here to be one having the largest possible value. Alternatively, the period may be preliminarily set based on a time for a reverse recovery current flowing through the drain-source of the MOSFET 2, 3 to be approximately zero, the reverse recovery current being assumed here to be one having a maximum rated current value.

According to the above embodiments, in order to determine an occurrence of the reverse recovery phenomenon and specify the MOSFET in which the reverse recovery phenomenon occurs, the power supply control signal generation element 6g controls the gate voltages of the MOSFETs with using the voltage signals Vri-hi and Vri-lo. The voltage signals Vri-hi and Vri-lo are provided based on conversion of the currents detected by the current detection units 5a, 5b connected with the Hi-MOSFET and the Lo-MOSFET 3.

Figure 18:
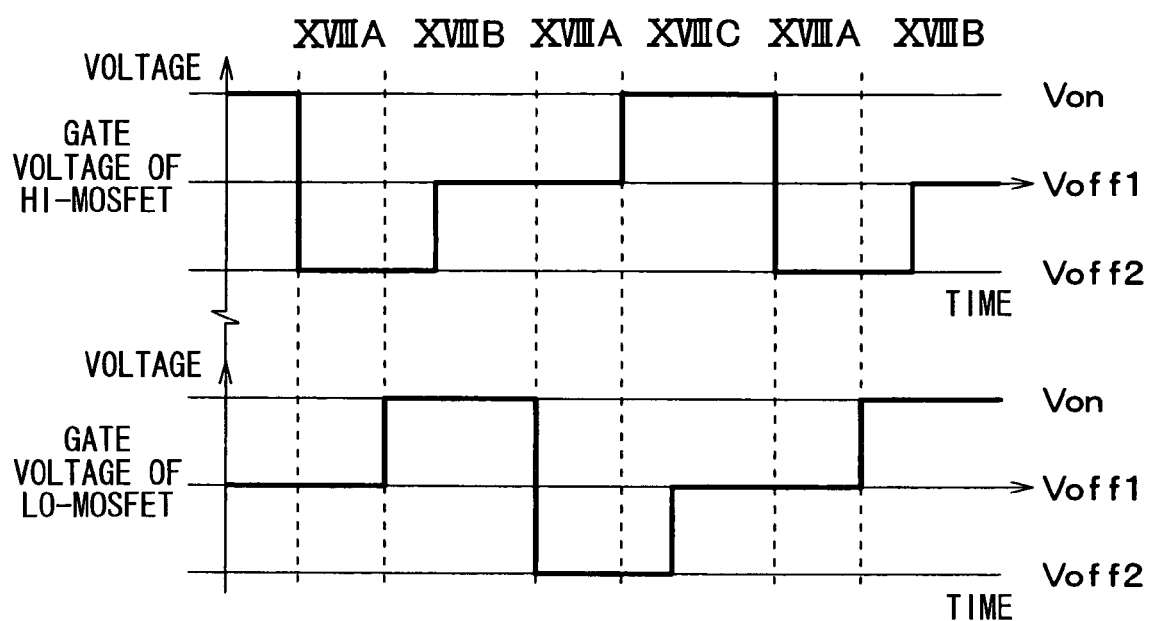
FIG. 18 is a timing chart illustrating a representative waveform of a gate signal for a Hi-MOSFET and a representative waveform of a gate signal for a Lo-MOSFET according to another modified embodiment.

When one of the MOSFETs is switched from the off state into the on state while the other of the MOSFETs is being maintained in the off state after the dead time, the reverse recovery phenomenon occurs in the other of the MOSFETs. For this reason, in an alternative configuration of method, a waveform of the gate voltage for the Lo-MOSFET 3 may be a half-cycle shifted waveform of the gate voltage of the Hi-MOSFET 2 according to the first and second embodiments, as shown in FIGS. 17 and 18. In addition, a time to finish the reverse recovery phenomenon may be preliminarily determined based on experiments. In this case, it may not be necessary to provide a detection unit for detecting the reverse recovery phenomenon, and thus, it may be possible to simplify control. It may be possible to decrease the size of a circuit with providing advantages substantially similar to that according to the first embodiment. In FIG. 17, a symbol XVIIA shows the dead time, a symbol XVIIB shows a period of the Lo-MOSFET being in the on state, and a symbol XVIIC shows a period of the Hi-MOSFET being in the on state. In FIG. 18, a symbol XVIIIA shows the dead time, a symbol XVIIIB shows a period of the Lo-MOSFET being in the on state, and a symbol XVIIIC shows a period of the Hi-MOSFET being in the on state.

In the above-described embodiment, it is assumed the built-in diode 2a, 3a and the external diode D1, D2 have characteristics and inter-relations that shown in FIG. 15. However, it is sufficient that a relation Vfd<Vf1<Vf2 or a relation Vf1<Vfd<Vf2 is satisfied.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for controlling a vertical type MOSFET in a bridge circuit, the bridge circuit including an external diode which is connected in inverse-parallel with and is external with respect to the vertical type MOSFET, the bridge circuit being configured so that a gate voltage of the vertical type MOSFET controls a forward voltage of a built-in diode of the vertical type MOSFET, the method comprising:

controlling the forward voltage of the built-in diode to be a first forward voltage by setting the gate voltage of the vertical MOSFET to a first gate voltage, so that the vertical type MOSFET is switched into a first off mode, which is one of modes in an off state of the vertical type MOSFET, wherein, in the first off mode, a current flowing through the built-in diode is larger than a current flowing through the external diode; and controlling the forward voltage of the built-in diode to be a second forward voltage by setting the gate voltage of the vertical MOSFET to a second gate voltage, so that the vertical type MOSFET is switched into a second off mode, which is another one of modes in the off state of the vertical type MOSFET, wherein, in the second off mode, the current flowing through the built-in diode is smaller than the current flowing through the external diode, wherein:

in the controlling the forward voltage of the built-in diode to be the first forward voltage and the controlling the forward voltage of the built-in diode to be the second forward voltage, a relation Vfd<Vf1<Vf2 or a relation Vf1<Vfd<Vf2 is satisfied, where Vf1, Vf2, and Vfd are defined as the first forward voltage of the built-in diode, the second forward voltage of the built-in diode, and a forward voltage of the external diode, respectively.

2. A method for controlling a first vertical type MOSFET and a second vertical type MOSFET, the first and second vertical type MOSFETs being connected in series to provide a half bridge circuit, the half bridge circuit including a first external diode which is connected in inverse-parallel with and is external with respect to the first vertical type MOSFET and a second external diode which is connected in inverse-parallel with and is external with respect to the second vertical type MOSFET, each vertical type MOSFET including a built-in diode, the half bridge circuit being configured so that a gate voltage of each vertical type MOSFET controls a forward voltage of the built-in diode of the vertical type MOSFET, the method comprising:

controlling the forward voltage of the built-in diode of each vertical type MOSFET to be a first forward voltage by setting the gate voltage of the vertical type MOSFET to a first gate voltage, so that the vertical type MOSFET is switched into a first off mode, which is one of modes in an off state of the vertical type MOSFET, wherein, in the first off mode, a current flowing through the built-in diode of the vertical type MOSFET is larger than a current flowing through the external diode connected in inverse-parallel with the vertical type MOSFET;

controlling the forward voltage of the built-in diode of each vertical type MOSFET to be a second forward voltage by setting the gate voltage of the vertical type MOSFET to a second gate voltage, so that the vertical type MOSFET is switched into a second off mode, which is another one of modes in the off state of the vertical type MOSFET, wherein, in the second off state, the current flowing through the built-in diode of the vertical type MOSFET is smaller than the current flowing through the external diode connected in inverse-parallel with the vertical type MOSFET;

setting the gate voltage of each vertical type MOSFET to a third gate voltage, so that the vertical type MOSFET is switched into an on state; and controlling the forward voltage of the built-in diode of the first vertical type MOSFET by setting the gate voltage of the first vertical type MOSFET when the second vertical type MOSFET is switched from the off state into the on state, so that the first vertical type MOSFET is controlled to be in the first off mode or the second off mode, wherein:

in the controlling the forward voltage of the built-in diode of each vertical type MOSFET to be the first forward voltage, in the controlling the forward voltage of the built-in diode of each vertical type MOSFET to be the second forward voltage, in the setting the gate voltage of each vertical type MOSFET to the third gate voltage, and in the controlling the forward voltage of the built-in diode of the first vertical type MOSFET, a relation Vfd<Vf1<Vf2 or a relation Vf1<Vfd<Vf2 is satisfied, where Vf1, Vf2, and Vfd are defined as the first forward voltage of the built-in diode of each vertical type MOSFET, the second forward voltage of the built-in diode of each vertical type MOSFET, and a forward voltage of the external diode connected with each vertical type MOSFET, respectively.

3. The method according to claim 2, further comprising:

setting a dead time when the first and second vertical type MOSFETs are alternately switched between the on state and the off state, wherein, in the dead time, both the first and second vertical type MOSFETs are in the off state; and switching the first vertical type MOSFET from the on state into the off state and switching the second vertical type MOSFET from the off state into the on state, wherein the switching the first and second vertical type MOSFETs includes:

switching the first vertical type MOSFET from the on state into the first off mode so that the dead time starts;

switching the first vertical type MOSFET into the second off mode;

switching the second vertical type MOSFET from the off state into the on state so that the dead time ends; and switching the first vertical type MOSFET into the first off mode after a predetermined period from the switching the second vertical type MOSFET from the off state into the on state.

4. The method according to claim 2, further comprising:

setting a dead time when the first and second vertical type MOSFETs are alternately switched between the on state and the off state, wherein, in the dead time, both the first and second vertical type MOSFETs are in the off state; and switching the first vertical type MOSFET from the on state into the off state and switching the second vertical type MOSFET from the off state into the on state, wherein the switching the first and second vertical type MOSFETs includes:

switching the first vertical type MOSFET from the on state into the second off mode so that the dead time starts;

switching the second vertical type MOSFET from the off state into the on state so that the dead time ends; and switching the first vertical type MOSFET into the first off mode after a predetermined period from the switching the second vertical type MOSFET from the off state into the on state.

5. The method according to claim 2, further comprising:

maintaining the first vertical type MOSFET in the off state and repeatedly switching the second vertical type MOSFET between the on state and the off state, wherein the repeatedly switching and the maintaining include:

switching the second vertical type MOSFET from the on state into the second off mode;

switching the first vertical type MOSFET into the second off mode;

switching the second vertical type MOSFET from the off state into the on state; and switching the first vertical type MOSFET into the first off mode after a predetermined period from the switching the second vertical type MOSFET from the off state into the on state.

6. The method according to claim 2, further comprising:

maintaining the first vertical type MOSFET in the off state and repeatedly switching the second vertical type MOSFET between the on state and the off state, wherein the maintaining and the repeatedly switching include:

switching the second vertical type MOSFET from the on state into the second off mode;

switching the first vertical type MOSFET into the second off mode;

switching the second vertical type MOSFET from the off state into the on state; and switching the first vertical type MOSFET into the first off mode and switching the second vertical type MOSFET from the on state into the off state.

7. The method according to claim 3, further comprising:

setting a first duration of time to be longer than a second duration of time required to change the gate voltage of each vertical type MOSFET from the first gate voltage to the second gate voltage, where the first duration of time is defined as a period between a time of the switching the first vertical type MOSFET into the second off mode and a time of the switching the second vertical type MOSFET from the off state into the on state.

8. The method according to claim 7, wherein the second duration of time is preliminarily determined.

9. The method according to claim 3, wherein the predetermined period is set to be longer than a duration of time required to finish a reverse recovery phenomenon, which occurs when the vertical type MOSFET is switched from the off state into the on state.

10. The method according to claim 9, further comprising:

detecting a current flowing through each vertical type MOSFET with using a current detection unit; and detecting a finish of the reverse recovery phenomenon based on the detected current, so that the duration of time is determined.

11. The method according to claim 9, wherein:

the duration of time is set to a period for a reverse recovery current to become approximately zero when a current flowing between a drain and a source of the vertical type MOSFET is maximum.

12. The method according to claim 9, wherein the duration of time is set to a period for a reverse recovery current to become approximately zero when a current flowing between a drain and a source of the vertical type MOSFET is maximum rated current.

13. The method according to claim 2, wherein:
each vertical type MOSFET is an accumulation-mode vertical type MOSFET;
the accumulation-mode vertical type MOSFET includes a base layer having a first conductivity type, a gate oxidation layer, and a channel layer having a second conductivity type; and
the channel layer is disposed between the base layer and the gate oxidation layer.

14. The method according to claim 2, wherein
the second gate voltage of each of the first and second vertical type MOSFET is set to be smaller than a threshold voltage of the vertical type MOSFET.

15. The method according to claim 2, wherein
the first gate voltage is set to be approximately 0 Volt, and a sum of the second gate voltage and the third gate voltage is set to be approximately 0 Volt.

* * * * *